US012775826B2

(12) United States Patent

Marukame et al.

(10) Patent No.: US 12,775,826 B2

(45) Date of Patent: Oct. 27, 2026

(54) VARIABLE RESISTANCE ELEMENT, STORAGE DEVICE, AND NEURAL NETWORK APPARATUS

(71) Applicant: KABUSHIKI KAISHA TOSHIBA, Tokyo (JP)

(72) Inventors: Takao Marukame, Tokyo (JP); Koichi Mizushima, Kamakura Kanagawa (JP); Yoshifumi Nishi, Yokohama Kanagawa (JP); Kumiko Nomura, Tokyo (JP)

(73) Assignee: KABUSHIKI KAISHA TOSHIBA, Kawasaki (JP)

( * ) Notice: Subject to any disclaimer, the term of this patent is extended or adjusted under 35 U.S.C. 154(b) by 1001 days.

(21) Appl. No.: 17/891,362

(22) Filed: Aug. 19, 2022

(65) Prior Publication Data

US 2023/0079071 A1 Mar. 16, 2023

(30) Foreign Application Priority Data

Sep. 15, 2021 (JP) ................................ 2021-149831
Jun. 2, 2022 (JP) ................................ 2022-090344

(51) Int. Cl.
*G06N 3/063* (2023.01)
*G11C 11/54* (2006.01)
(Continued)

(52) U.S. Cl.
CPC .............. *G06N 3/063* (2013.01); *G11C 11/54* (2013.01); *G11C 13/0011* (2013.01);
(Continued)

(58) Field of Classification Search
CPC .......... G06N 3/063; G06N 3/08; G06N 3/065; G11C 11/54; G11C 13/0011;
(Continued)

(56) References Cited

U.S. PATENT DOCUMENTS

| | | | |
|---|---|---|---|
| 10,175,947 B1 | 1/2019 | Marukame et al. |
| 2013/0346825 A1 | 12/2013 | Marukame et al. |

(Continued)

FOREIGN PATENT DOCUMENTS

| | | |
|---|---|---|
| JP | 2014-7496 A | 1/2014 |
| JP | 2017-521854 A | 8/2017 |

(Continued)

OTHER PUBLICATIONS

Masahiro Tatsumisago, "Lithium ion conductor," J-STAGE Jour of Electrochemistry, The Electrochemical Society of Japan, vol. 69, No. 10, pp. 793-797 (2001), and machine translation, 7 pages.

(Continued)

*Primary Examiner* — Amir Zarabian
*Assistant Examiner* — Bradley S Coon
(74) *Attorney, Agent, or Firm* — Finnegan, Henderson, Farabow, Garrett & Dunner, LLP

(57) ABSTRACT

A variable resistance element according to an embodiment serves to change to a low resistance state or a high resistance state. The variable resistance element includes a first transition metal compound layer, a second transition metal compound layer, and a lithium ion conductor layer. The first transition metal compound layer is connected to a first electrode. The first transition metal compound layer is a metal compound containing lithium ions in lattice interstices. The second transition metal compound layer is connected to a second electrode. The second transition metal compound layer is a metal compound containing lithium ions in lattice interstices. The lithium ion conductor layer is provided between the first transition metal compound layer and the second transition metal compound layer. The lithium ion conductor layer is a solid substance that is permeable to lithium ions and is less permeable to electrons.

19 Claims, 24 Drawing Sheets

21: FIRST ELECTRODE
22: SECOND ELECTRODE
23: FIRST TRANSITION METAL COMPOUND LAYER
24: SECOND TRANSITION METAL COMPOUND LAYER
25: LITHIUM ION CONDUCTOR LAYER

(51) Int. Cl.
*G11C 13/00* (2006.01)
*H10N 70/00* (2023.01)
*H10N 70/20* (2023.01)

(52) U.S. Cl.
CPC ......... *G11C 13/004* (2013.01); *H10N 70/245* (2023.02); *H10N 70/8836* (2023.02); *G11C 2213/31* (2013.01)

(58) Field of Classification Search
CPC .............. G11C 13/004; G11C 2213/31; G11C 2013/0073; G11C 13/0069; H10N 70/245; H10N 70/8836; H10N 70/801; H10N 70/823; Y02E 60/10
See application file for complete search history.

(56) References Cited

U.S. PATENT DOCUMENTS

| | | | |
|---|---|---|---|
| 2017/0148982 | A1 | 5/2017 | Karpov et al. |
| 2018/0211154 | A1 | 7/2018 | Mori et al. |
| 2018/0358552 | A1 | 12/2018 | Brew et al. |
| 2018/0358553 | A1 | 12/2018 | Brew et al. |
| 2018/0374535 | A1 | 12/2018 | Brew et al. |
| 2019/0156181 | A1 | 5/2019 | Marukame et al. |
| 2019/0157552 | A1 | 5/2019 | Brew et al. |
| 2019/0318239 | A1* | 10/2019 | Kim ......................... G06N 3/08 |
| 2020/0026496 | A1 | 1/2020 | Marukame et al. |
| 2020/0034695 | A1 | 1/2020 | Marukame et al. |
| 2020/0066338 | A1* | 2/2020 | Noshiro .............. G11C 13/0011 |
| 2020/0250516 | A1 | 8/2020 | Li et al. |
| 2020/0293861 | A1 | 9/2020 | Marukame et al. |
| 2020/0302274 | A1 | 9/2020 | Marukame et al. |
| 2020/0357995 | A1 | 11/2020 | Copel et al. |
| 2020/0380347 | A1 | 12/2020 | Marukame et al. |
| 2020/0411760 | A1* | 12/2020 | Kurita ................ H10N 70/8416 |
| 2021/0081771 | A1 | 3/2021 | Marukame et al. |
| 2021/0216282 | A1 | 7/2021 | Marukame et al. |
| 2021/0279559 | A1 | 9/2021 | Nishi et al. |
| 2022/0068326 | A1 | 3/2022 | Marukame et al. |
| 2022/0083845 | A1 | 3/2022 | Marukame et al. |
| 2022/0138547 | A1 | 5/2022 | Saito et al. |
| 2022/0215229 | A1 | 7/2022 | Nishi et al. |
| 2022/0237452 | A1 | 7/2022 | Marukame et al. |

FOREIGN PATENT DOCUMENTS

| | | | |
|---|---|---|---|
| JP | 2018-120433 | A | 8/2018 |
| JP | 2019-53563 | A | 4/2019 |
| JP | 2019-95860 | A | 6/2019 |
| JP | 2019195022 | A * | 11/2019 |
| JP | 2020-13398 | A | 1/2020 |
| JP | 2020-17114 | A | 1/2020 |
| JP | 2020-31178 | A | 2/2020 |
| JP | 2020-523777 | A | 8/2020 |
| JP | 2020-524897 | A | 8/2020 |
| JP | 2021-47530 | A | 3/2021 |
| JP | 2021-111142 | A | 8/2021 |
| JP | 2021-140320 | A | 9/2021 |
| JP | 2022-37319 | A | 3/2022 |
| JP | 2022-49425 | A | 3/2022 |
| JP | 2022-106592 | A | 7/2022 |
| JP | 2022-114793 | A | 8/2022 |
| WO | WO 2019/187032 | A1 | 10/2019 |

OTHER PUBLICATIONS

Yuki Nomura, et al., "Direct Observation of a Li-Ionic Space-Charge Layer Formed at an Electrode/Solid-Electrolyte Interface," Wiley Online Library, Angew. Chem. Int. Ed., vol. 58, pp. 5292-5296 (2019).
Y. Watanabe, et al., "Synapse-like behavior observed in voltage-switching RAM", 66th Lecture Academic in the Japan Society of Applied Physics Spring Lecture Proceeding (2019 Tokyo Institute of Technology Ookayama Campuses), 1 page, and machine translation, 2 pages.
Japan Patent Office, Office Action in JP App. No. 2022-090344 (May 7, 2025).

* cited by examiner

LOW RESISTANCE STATE

HIGH RESISTANCE STATE

21: FIRST ELECTRODE
22: SECOND ELECTRODE
23: FIRST TRANSITION METAL COMPOUND LAYER
24: SECOND TRANSITION METAL COMPOUND LAYER
25: LITHIUM ION CONDUCTOR LAYER
31: FIRST ELECTROLYTE LAYER
32: SECOND ELECTROLYTE LAYER
33: THIRD ELECTROLYTE LAYER

FIG.18

| BULK RESIST-ANCE RATIO | FIRST ELEC-TRODE | FIRST TRANSITION METAL COMPOUND LAYER | INTER-FACE RESIST-ANCE | FIRST ELEC-TROLYTE LAYER | SECOND ELEC-TROLYTE LAYER | THIRD ELEC-TROLYTE LAYER | INTER-FACE RESIST-ANCE | SECOND TRANSITION METAL COMPOUND LAYER | SECOND ELEC-TRODE | COMBINED RESISTANCE VALUE IN HIGH RESISTANCE STATE |
|---|---|---|---|---|---|---|---|---|---|---|
| 0 | 1 | 10 | 1.00E+12 | 0.00E+00 | 1.00E+11 | 0.00E+00 | 1.00E+12 | 1.00E+10 | 1 | 2.11E+12 |
| 1 | 1 | 10 | 1.00E+10 | 1.00E+11 | 1.00E+11 | 1.00E+11 | 1.00E+10 | 1.00E+10 | 1 | 3.30E+11 |
| 2 | 1 | 10 | 1.00E+10 | 2.00E+11 | 1.00E+11 | 2.00E+11 | 1.00E+10 | 1.00E+10 | 1 | 5.30E+11 |
| 5 | 1 | 10 | 1.00E+10 | 5.00E+11 | 1.00E+11 | 5.00E+11 | 1.00E+10 | 1.00E+10 | 1 | 1.13E+12 |
| 10 | 1 | 10 | 1.00E+10 | 1.00E+12 | 1.00E+11 | 1.00E+12 | 1.00E+10 | 1.00E+10 | 1 | 2.13E+12 |
| 20 | 1 | 10 | 1.00E+10 | 2.00E+12 | 1.00E+11 | 2.00E+12 | 1.00E+10 | 1.00E+10 | 1 | 4.13E+12 |
| 50 | 1 | 10 | 1.00E+10 | 5.00E+12 | 1.00E+11 | 5.00E+12 | 1.00E+10 | 1.00E+10 | 1 | 1.01E+13 |

FIG. 19

| BULK RESISTANCE RATIO | FIRST ELECTRODE | FIRST TRANSITION METAL COMPOUND LAYER | INTERFACE RESISTANCE | FIRST ELECTROLYTE LAYER | SECOND ELECTROLYTE LAYER | THIRD ELECTROLYTE LAYER | INTERFACE RESISTANCE | SECOND TRANSITION METAL COMPOUND LAYER | SECOND ELECTRODE | COMBINED RESISTANCE VALUE IN LOW RESISTANCE STATE |
|---|---|---|---|---|---|---|---|---|---|---|
| 0 | 1 | 10 | 1.00E+12 | 0.00E+00 | 1.00E+11 | 0.00E+00 | 1.00E+12 | 1.00E+01 | 1 | 2.1E+12 |
| 1 | 1 | 10 | 1.00E+10 | 1.00E+11 | 1.00E+11 | 1.00E+11 | 1.00E+10 | 1.00E+01 | 1 | 3.2E+11 |
| 2 | 1 | 10 | 1.00E+10 | 2.00E+11 | 1.00E+11 | 2.00E+11 | 1.00E+10 | 1.00E+01 | 1 | 5.2E+11 |
| 5 | 1 | 10 | 1.00E+10 | 5.00E+11 | 1.00E+11 | 5.00E+11 | 1.00E+10 | 1.00E+01 | 1 | 1.12E+12 |
| 10 | 1 | 10 | 1.00E+10 | 1.00E+12 | 1.00E+11 | 1.00E+12 | 1.00E+10 | 1.00E+01 | 1 | 2.12E+12 |
| 20 | 1 | 10 | 1.00E+10 | 2.00E+12 | 1.00E+11 | 2.00E+12 | 1.00E+10 | 1.00E+01 | 1 | 4.12E+12 |
| 50 | 1 | 10 | 1.00E+10 | 5.00E+12 | 1.00E+11 | 5.00E+12 | 1.00E+10 | 1.00E+01 | 1 | 1.012E+13 |

21: FIRST ELECTRODE
22: SECOND ELECTRODE
23: FIRST TRANSITION METAL COMPOUND LAYER
24: SECOND TRANSITION METAL COMPOUND LAYER
25: LITHIUM ION CONDUCTOR LAYER
35: FIRST COMPOUND LAYER
36: SECOND COMPOUND LAYER

40

VARIABLE RESISTANCE ELEMENT, STORAGE DEVICE, AND NEURAL NETWORK APPARATUS

CROSS-REFERENCE TO RELATED APPLICATIONS

This application is based upon and claims the benefit of priority from Japanese Patent Application No. 2022-090344, filed on Jun. 2, 2022, which claims the benefit of priority from Japanese Patent Application No. 2021-149831, filed on Sep. 15, 2021; the entire contents of which are incorporated herein by reference.

FIELD

Embodiments described herein relate generally to a variable resistance element, a storage device, and a neural network apparatus.

BACKGROUND

In recent years, a neural network apparatus implemented by hardware has been studied. In addition, there is a known neuromorphic neural network that mimics a human brain, that is, a brain-inspired neural network. The brain-inspired neural network is a neural network that mimics a human brain operating with low energy consumption and having high fault tolerance.

In the field of the brain-inspired neural network, there has been a demand for development of new hardware as well as algorithms, and in particular, a high demand for development of novel variable resistive nonvolatile memory. Various types of variable resistive nonvolatile memory referred to as resistive RAM (ReRAM) have been proposed as elements for neurons or synaptic circuits. However, any type of variable resistive nonvolatile memory has large variations in characteristics for individual elements. For this reason, a large-scale brain-inspired neural network using variable resistive nonvolatile memory has not been developed yet.

For example, one type of known ReRAM is an element having a structure in which metal electrodes are provided at both ends of a transition metal oxide such as $TiO_2$. By applying voltage or electric current pulse between the metal electrodes, the ReRAM having such a structure changes the amount or distribution of oxygen deficiency present in the transition metal oxide. In the ReRAM having such a structure, an increase in the oxygen deficiency leads to introduction of electrons into the vicinity of the oxygen deficiency in order to maintain electrical neutrality, causing the ReRAM to have a low resistance state (LRS). On the contrary, the ReRAM having such a structure has a high resistance state (HRS) when the oxygen deficiency decreases. However, the ReRAM having such a structure also has large variations in characteristics, making it difficult to be applied to a large brain-inspired neural network.

BRIEF DESCRIPTION OF THE DRAWINGS

FIG. 18 is a diagram illustrating a calculation example of resistance values in individual portions in a high resistance state;

FIG. 19 is a diagram illustrating a calculation example of resistance values in individual portions in a low resistance state;

DETAILED DESCRIPTION

A variable resistance element according to an embodiment serves to change to a low resistance state or a high resistance state. The variable resistance element includes a first transition metal compound layer, a second transition metal compound layer, and a lithium ion conductor layer. The first transition metal compound layer is connected to a first electrode. The first transition metal compound layer is a metal compound containing lithium ions in lattice interstices. The second transition metal compound layer is connected to a second electrode. The second transition metal compound layer is a metal compound containing lithium ions in lattice interstices. The lithium ion conductor layer is provided between the first transition metal compound layer and the second transition metal compound layer. The lithium ion conductor layer is a solid substance that is permeable to lithium ions and is less permeable to electrons.

First Embodiment

Figure 1:
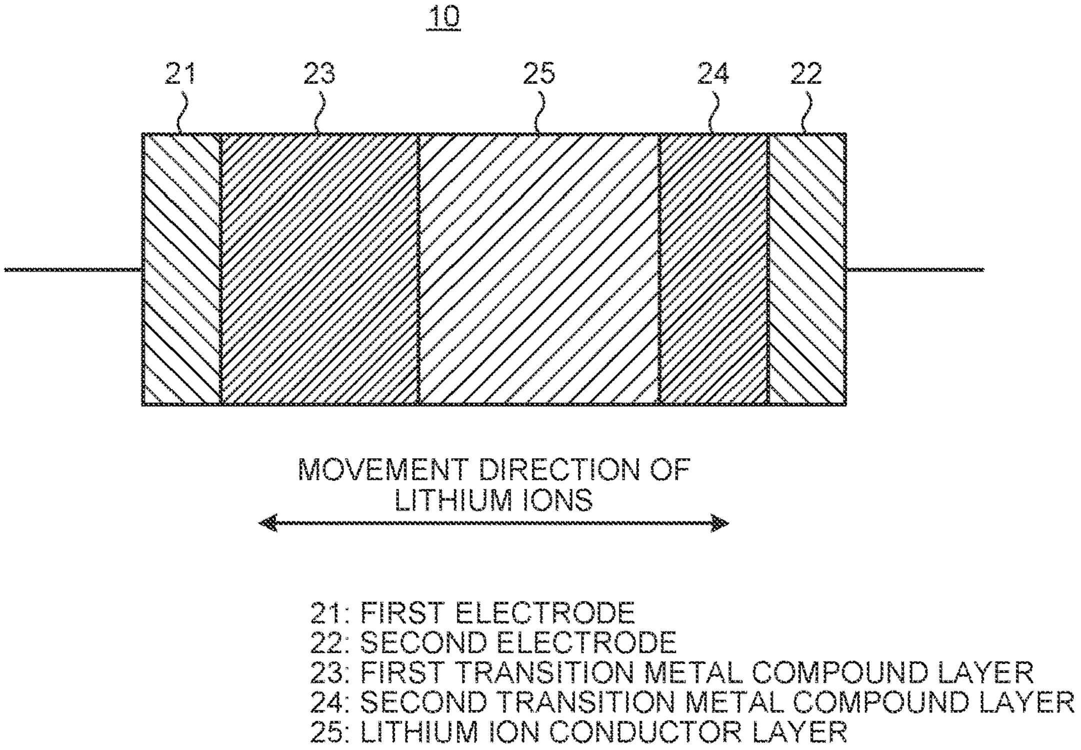
FIG. 1 is a diagram illustrating a configuration of a variable resistance element according to a first embodiment.

FIG. 1 is a diagram illustrating a configuration of a variable resistance element 10 according to a first embodiment.

The variable resistance element 10 according to the first embodiment changes its state to a low resistance state or a high resistance state by internal movement of lithium ions. The low resistance state is a state where electric current is allowed to flow. The high resistance state is a state where no electric current flows in a given direction. As an example, the variable resistance element 10 is used as an element for a neuron circuit or a synaptic circuit in a brain-inspired neural network. Note that the low resistance state and the high resistance state may have a difference in resistance between them, which is enough to relatively determine whether or not electric current is flowing when detection of electric current is performed. In other words, the low resistance state may be a state where only a small amount of electric current is detected, as long as such a small amount is enough to determine that electric current is flowing in comparison with an amount of electric current in the high resistance state. By contrast, the high resistance state may be a state where a small amount of electric current flowing in the given direction is detected, as long as such a small amount is enough to determine that electric current is not flowing in comparison with an amount of electric current in the low resistance state.

The variable resistance element 10 includes a first electrode 21, a second electrode 22, a first transition metal compound layer 23, a second transition metal compound layer 24, and a lithium ion conductor layer 25. The variable resistance element 10 has a layer structure formed by the first electrode 21, the first transition metal compound layer 23, the lithium ion conductor layer 25, the second transition metal compound layer 24, and the second electrode 22, in this order.

In the variable resistance element 10, a direction perpendicular to a surface across which the first transition metal compound layer 23 and the second transition metal compound layer 24 face each other is a movement direction of lithium ions. That is, in the variable resistance element 10, a stacking direction, in which the first electrode 21, the first transition metal compound layer 23, the lithium ion conductor layer 25, the second transition metal compound layer 24, and the second electrode 22 are stacked, is the movement direction of lithium ions. For example, the first electrode 21, the first transition metal compound layer 23, the lithium ion conductor layer 25, the second transition metal compound layer 24, and the second electrode 22 have the same shape and size of a junction perpendicular to the moving direction of lithium ions.

In the present embodiment, the film thickness in the moving direction of lithium ions of the second transition metal compound layer 24 is smaller than that of the first transition metal compound layer 23. However, the film thickness in the moving direction of lithium ions of the second transition metal compound layer 24 may be the same as or less than that of the first transition metal compound layer 23.

The first electrode 21 and the second electrode 22 are each connected to an external electric circuit. Voltage is applied from an electric circuit between the first electrode 21 and the second electrode 22.

The first transition metal compound layer 23 is connected to the first electrode 21. The second transition metal compound layer 24 is connected to the second electrode 22.

The first transition metal compound layer 23 and the second transition metal compound layer 24 are each formed of a metal compound containing lithium ions in lattice interstices. Lithium ions contained in the first transition metal compound layer 23 and the second transition metal compound layer 24 move between the first transition metal compound layer 23 and the second transition metal compound layer 24 by applying voltage between the first electrode 21 and the second electrode 22. Additionally, by applying the voltage, internal electrons move individually in the first transition metal compound layer 23 and the second transition metal compound layer 24.

The first transition metal compound layer 23 and the second transition metal compound layer 24 may each be a metal oxide containing lithium ions in lattice interstices. In the present embodiment, the first transition metal compound layer 23 is formed of $Li_{x-y}TiO_2$. In the present embodiment, the second transition metal compound layer 24 is formed of $Li_yTiO_2$. x denotes a constant greater than 0. y denotes a variable having a value of 0 or more and x or less. x-y represents the composition of lithium ions in the first transition metal compound layer 23. y represents the composition of lithium ions in the second transition metal compound layer 24.

Note that, when one of the first transition metal compound layer 23 and the second transition metal compound layer 24 contains all lithium ions, the other does not contain lithium ions. Therefore, there is a case that the first transition metal compound layer 23 has a composition of lithium ions x-y=0. In addition, there is a case that the second transition metal compound layer 24 has a composition of lithium ions y=0. Note that the first transition metal compound layer 23 and the second transition metal compound layer 24 may each be a lithium metal or a lithium alloy.

The lithium ion conductor layer 25 is formed between the first transition metal compound layer 23 and the second transition metal compound layer 24. The lithium ion conductor layer 25 is formed of a solid substance that is permeable to lithium ions and is less permeable to electrons. The lithium ion conductor layer 25 is formed of, for example, a solid substance that hardly allows electrons to permeate as compared with high permeability of lithium ions. For example, the lithium ion conductor layer 25 can be implemented by the material disclosed in Non-Patent Literature Masahiro TATSUMISAGO, "Lithium Ion Conductor", J-STAGE, Journal, Electrochemistry, The Electrochemical Society of Japan, 2001, Vol. 69, Issue 10, p. 793-797. The lithium ion conductor layer 25 may be formed of other materials, not limited to the material disclosed in Non-Patent Literature 1: Masahiro TATSUMISAGO. "Lithium Ion Conductor", J-STAGE, Journal, Electrochemistry, The Electrochemical Society of Japan, 2001, Vol. 69, Issue 10, p. 793-797. The lithium ion conductor layer 25 is also referred to as a solid electrolyte.

Figure 2:
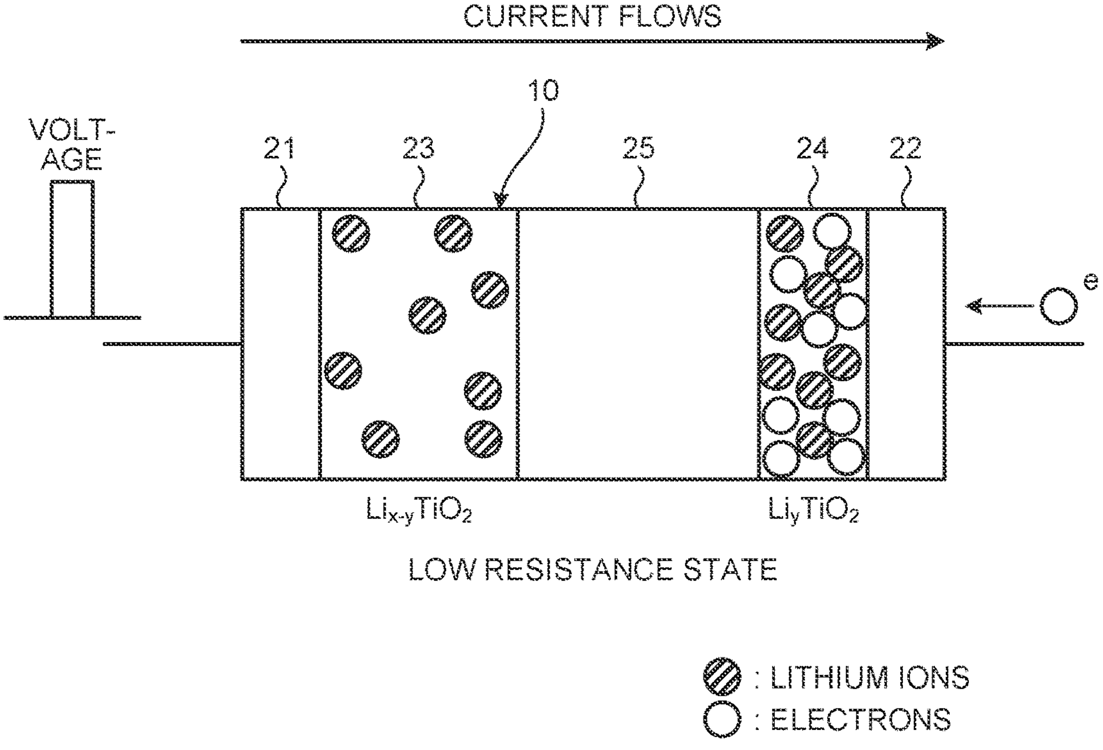
FIG. 2 is a view illustrating a variable resistance element in a low resistance state.

FIG. 2 is a diagram illustrating the variable resistance element 10 in a low resistance state.

In the low resistance state, the variable resistance element 10 contains a given amount or more of lithium ions in the second transition metal compound layer 24. In this state, when voltage that the first electrode 21 side is higher and the second electrode 22 side is lower is applied to the variable resistance element 10, electrons are supplied to the second electrode 22 from an external electric circuit. The second transition metal compound layer 24 contains a given amount or more of lithium ions as positive ions. Thus, electrons supplied from the second electrode 22 are taken into the second transition metal compound layer 24. Therefore, in the low resistance state. When voltage that the first electrode 21 side is higher and the second electrode 22 side is lower is applied to the variable resistance element 10, electric current can flow in a direction from the first electrode 21 toward the second electrode 22.

In this manner, the variable resistance element 10 changes to the low resistance state in a state where the second transition metal compound layer 24 contains a given amount or more of lithium ions.

Figure 3:
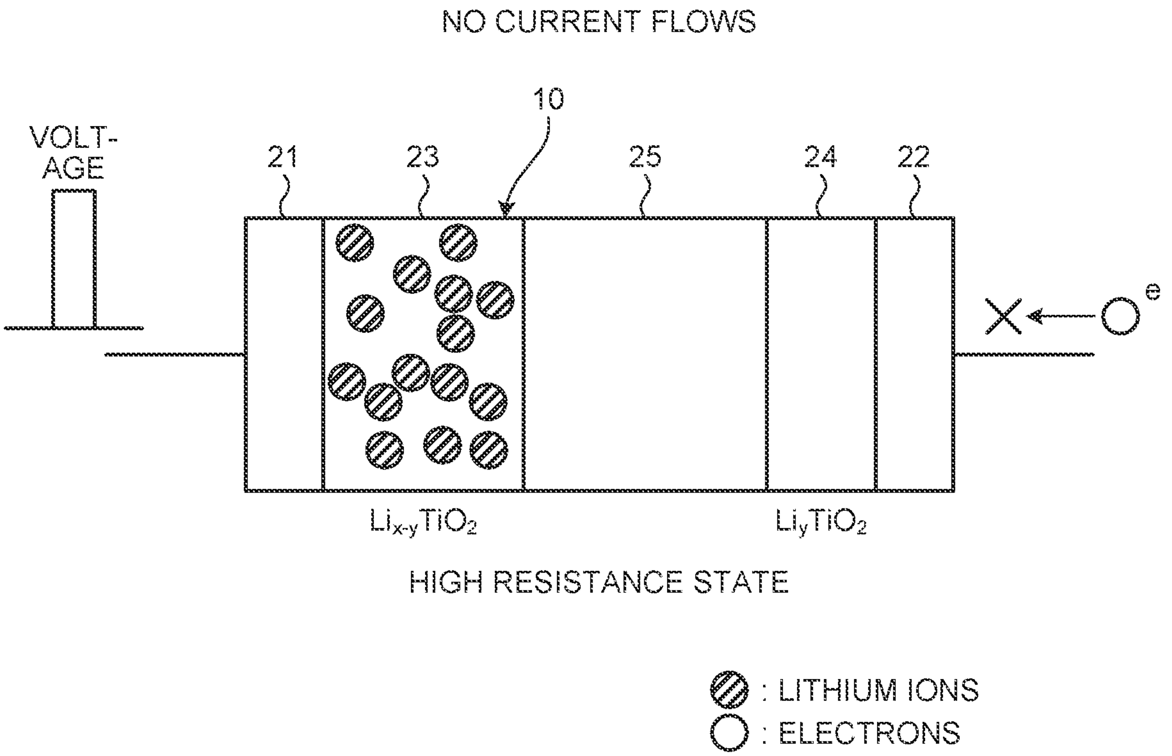
FIG. 3 is a view illustrating a variable resistance element in a high resistance state.

FIG. 3 is a diagram illustrating the variable resistance element 10 in a high resistance state.

In the high resistance state, the variable resistance element 10 is in a state where the first transition metal compound layer 23 contains lithium ions and the second transition metal compound layer 24 contains smaller than a given amount of lithium ions. Preferably, in the high resistance state, the variable resistance element 10 is in a state where the second transition metal compound layer 24 contains no lithium ions. In this state, when voltage that the first electrode 21 side is higher and the second electrode 22 side is lower is applied to the variable resistance element 10, an electric field, which causes electrons to move in a direction toward the second transition metal compound layer 24, is applied to the second electrode 22. However, since the second transition metal compound layer 24 contains no or very few lithium ions as positive ions, electrons supplied from the second electrode 22 side will not be taken into the second transition metal compound layer 24. Therefore, in the high resistance state, even when voltage that the first electrode 21 side is higher and the second electrode 22 side is lower is applied to the variable resistance element 10, electric current cannot flow in a direction from the first electrode 21 toward the second electrode 22.

In this manner, in a state where the first transition metal compound layer 23 contains lithium ions and the second transition metal compound layer 24 contains lithium ions less than a given amount, the variable resistance element 10 changes to the high resistance state in which no electric current flows in the direction from the first electrode 21 toward the second electrode 22.

As described above, the variable resistance element 10 according to the present embodiment changes the composition of lithium ions contained in the lattice interstices of the first transition metal compound layer 23 and the second transition metal compound layer 24, thereby implementing the low resistance state and the high resistance state. For example, the known ReRAM having a structure in which metal electrodes are provided at both ends of $TiO_2$ or the like uses oxygen deficiency with low mobility, and thus has a low annealing effect of stably maintaining the low resistance state and the high resistance state, leading to large variations in characteristics of individual elements. In contrast, lithium ions have higher mobility than oxygen deficiency. In view of this, by introducing lithium ions having high mobility into the lattice interstices, the variable resistance element 10 according to the present embodiment can increase the annealing effect and stably maintain the low resistance state and the high resistance state. Consequently, the variable resistance element 10 according to the present embodiment can reduce variations in characteristics for individual elements in each state of the low resistance state and the high resistance state.

Meanwhile, even when the composition of lithium ions contained in the first transition metal compound layer 23 and the second transition metal compound layer 24 is changed by moving lithium ions, occurrence of diffusion of lithium ions by electrons supplied from the first electrode 21 and the second electrode 22 in a state where an electric field is not applied would lead to a result that the element cannot maintain a low resistance state or a high resistance state.

However, the variable resistance element 10 according to the present embodiment includes the lithium ion conductor layer 25 between the first transition metal compound layer 23 and the second transition metal compound layer 24. The lithium ion conductor layer 25 is permeable to lithium ions and is less permeable to electrons. Therefore, electrons on the side of the second transition metal compound layer 24 will not reach the first transition metal compound layer 23 through the lithium ion conductor layer 25. Accordingly, when no voltage is applied, lithium ions contained in the first transition metal compound layer 23 will not diffuse into the second transition metal compound layer 24 through the lithium ion conductor layer 25 to keep the principle of electroneutrality. Similarly, when no voltage is applied, lithium ions contained in the second transition metal compound layer 24 will not diffuse into the first transition metal compound layer 23 through the lithium ion conductor layer 25 to keep the principle of electroneutrality. Consequently, in the variable resistance element 10 according to the present embodiment, when no voltage is applied, it is possible to maintain the composition of lithium ions contained in the first transition metal compound layer 23 and the second transition metal compound layer 24, leading to the state where the low resistance state or the high resistance state can be maintained.

The resistance value of the variable resistance element 10 in the low resistance state is determined by a combined resistance value of the first transition metal compound layer 23, the second transition metal compound layer 24, and the lithium ion conductor layer 25. In many cases, the resistance value of the lithium ion conductor layer 25 is sufficiently larger than the resistance values of the first transition metal compound layer 23 and the second transition metal compound layer 24. Therefore, the resistance value of the variable resistance element 10 in the low resistance state is determined by the resistance value of the lithium ion conductor layer 25. The resistance value of the lithium ion conductor layer 25 is about $10\Omega$ to $100\Omega$ when a junction area is 100 nm×100 nm, for example.

The resistance value of the variable resistance element 10 in the high resistance state is determined by the resistance value of the second transition metal compound layer 24. The resistance value of the variable resistance element 10 in the high resistance state is preferably higher.

In the present embodiment, the second transition metal compound layer 24 is thinner, in film thickness in the lithium ion movement direction, namely, in the stacking direction, than the first transition metal compound layer 23. In the variable resistance element 10 having such a configuration, lithium ions contained in the second transition metal compound layer 24 can be reduced to 0 in the high resistance state, making it possible to achieve a high resistance value. Furthermore, due to that fact that the variable resistance element 10 having such a configuration can reduce the lithium ions contained in the second transition metal compound layer 24, when the state is changed from the low resistance state to the high resistance state, it is possible to move the lithium ions from the second transition metal compound layer 24 to the first transition metal compound layer 23 in a short time. In addition, the variable resistance element 10 having such a configuration can contain many lithium ions in the first transition metal compound layer 23 in the low resistance state, making it possible to increase the amount of electric current flow.

In addition, the second transition metal compound layer 24 preferably has less oxygen deficiency. With this condition, the variable resistance element 10 can achieve a high resistance value in the high resistance state. For example, the second transition metal compound layer 24 is preferably formed of a composition ratio of Ti to O being 1:2 in $TiO_2$ as a base material. This reduces oxygen deficiency in the second transition metal compound layer 24. The first transition metal compound layer 23 may have a configuration similar to this.

In addition, the second transition metal compound layer 24 may be implemented by a base material having a wide band gap. Even with this condition, the variable resistance element 10 can achieve a high resistance value in the high resistance state. For example, the second transition metal compound layer 24 may be formed of $Li_yZrO_2$ or $Li_yHfO_2$. The first transition metal compound layer 23 may also be implemented by the same base material as the second transition metal compound layer 24. That is, the first transition metal compound layer 23 may be formed of $Li_{x-y}ZrO_2$ or $Li_{x-y}HfO_2$. In addition, the first transition metal compound layer 23 may be $Li_yCoO_2$.

Note that, regarding the thickness in the moving direction of lithium ions, the film thickness of the second transition metal compound layer 24 may be the same as the thickness of the first transition metal compound layer 23 or may be greater than the thickness of the first transition metal compound layer 23. The second transition metal compound layer 24 can achieve a higher resistance value in a high resistance state with a greater film thickness in the movement direction of lithium ions.

Figure 4:
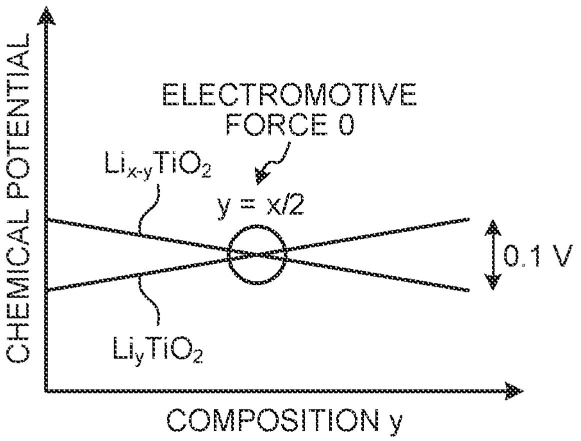
FIG. 4 is a view illustrating a chemical potential with respect to a composition of a transition metal compound layer.
Figure 5:
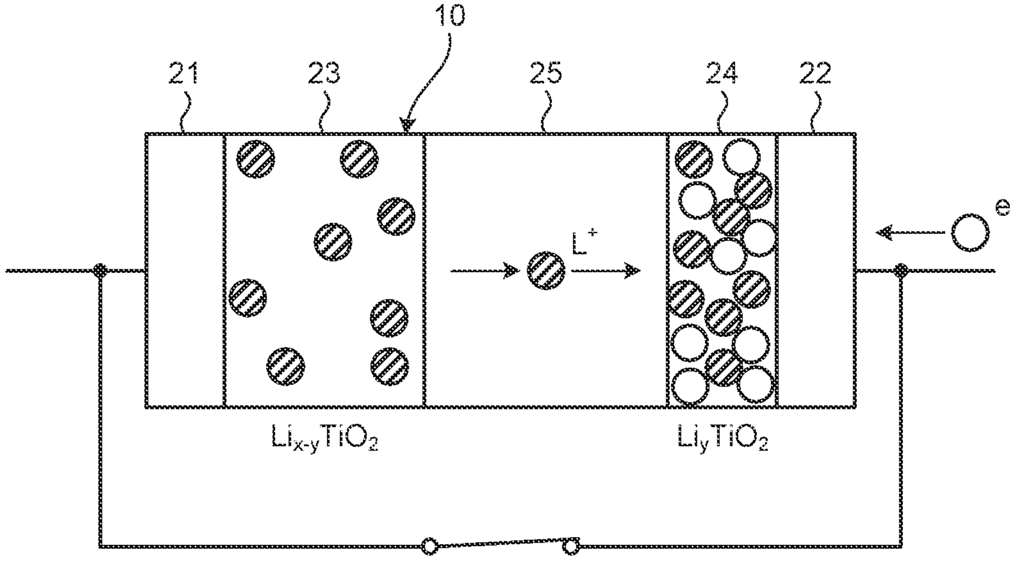
FIG. 5 is a view illustrating a state in which a first electrode and a second electrode are short-circuited to each other.

FIG. 4 is a diagram illustrating the chemical potential with respect to the composition of the first transition metal compound layer 23 and the second transition metal compound layer 24. FIG. 5 is a diagram illustrating a state in which the first electrode 21 and the second electrode 22 are short-circuited to each other.

In the low resistance state, the variable resistance element 10 generates electromotive force between the first electrode 21 and the second electrode 22 due to a difference in composition of respective lithium ions contained in the first transition metal compound layer 23 and the second transition metal compound layer 24. In the present embodiment, the first transition metal compound layer 23 and the second transition metal compound layer 24 are formed of metal compounds of the same base material, so that the electromotive force is, for example, about 0.1 V at the maximum as illustrated in FIG. 4.

Additionally, in a case where such an electromotive force affects the circuit operation, the circuit serving to control the variable resistance element 10 may short-circuit between the first electrode 21 and the second electrode 22 for about 100 μs, for example, as illustrated in FIG. 5. This operation causes the variable resistance element 10 to obtain electromotive force 0 due to discharge. Incidentally, the circuit serving to control the variable resistance element 10 may electrically connect the first electrode 21 and the second electrode 22 to each other via a resistor or the like. When the composition of lithium ions contained in the first transition metal compound layer 23 is x-y in a state where the electromotive force is 0, the composition of lithium ions contained in the second transition metal compound layer 24 is y=x/2.

Figure 6:
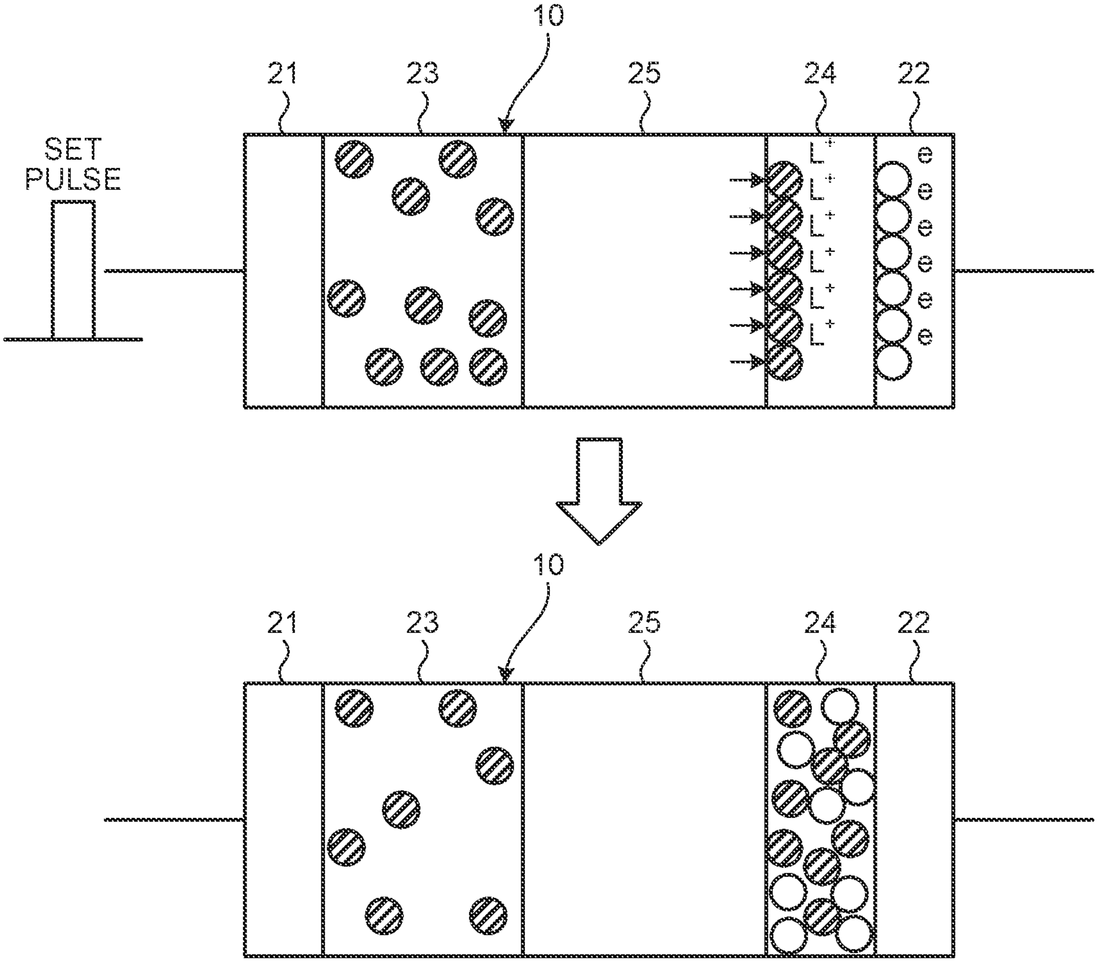
FIG. 6 is a diagram illustrating a state of a variable resistance element when a set pulse is applied.

FIG. 6 is a diagram illustrating a state of the variable resistance element 10 when a set pulse is applied.

When changing the variable resistance element 10 to be in the low resistance state, circuits serving to control the variable resistance element 10 applies, to the first electrode 21, a set pulse of a positive voltage higher than the second electrode 22. Note that applying, to the first electrode 21, a set pulse of a positive voltage higher than the second electrode 22 is similar to applying, to the second electrode 22, a set pulse of a negative voltage lower than the first electrode 21.

The lithium ions contained in the first transition metal compound layer 23 move to the second transition metal compound layer 24 while passing through the lithium ion conductor layer 25 due to the electric field generated by the set pulse. When the lithium ions reach the second transition metal compound layer 24, the second transition metal compound layer 24 takes in electrons from the second electrode 22. Then, the second transition metal compound layer 24 is changed from a state not containing lithium ions to a state containing lithium ions. The second transition metal compound layer 24 changes from an insulator to a conductor. This makes it possible to change the variable resistance element 10 to a low resistance state.

Figure 7:
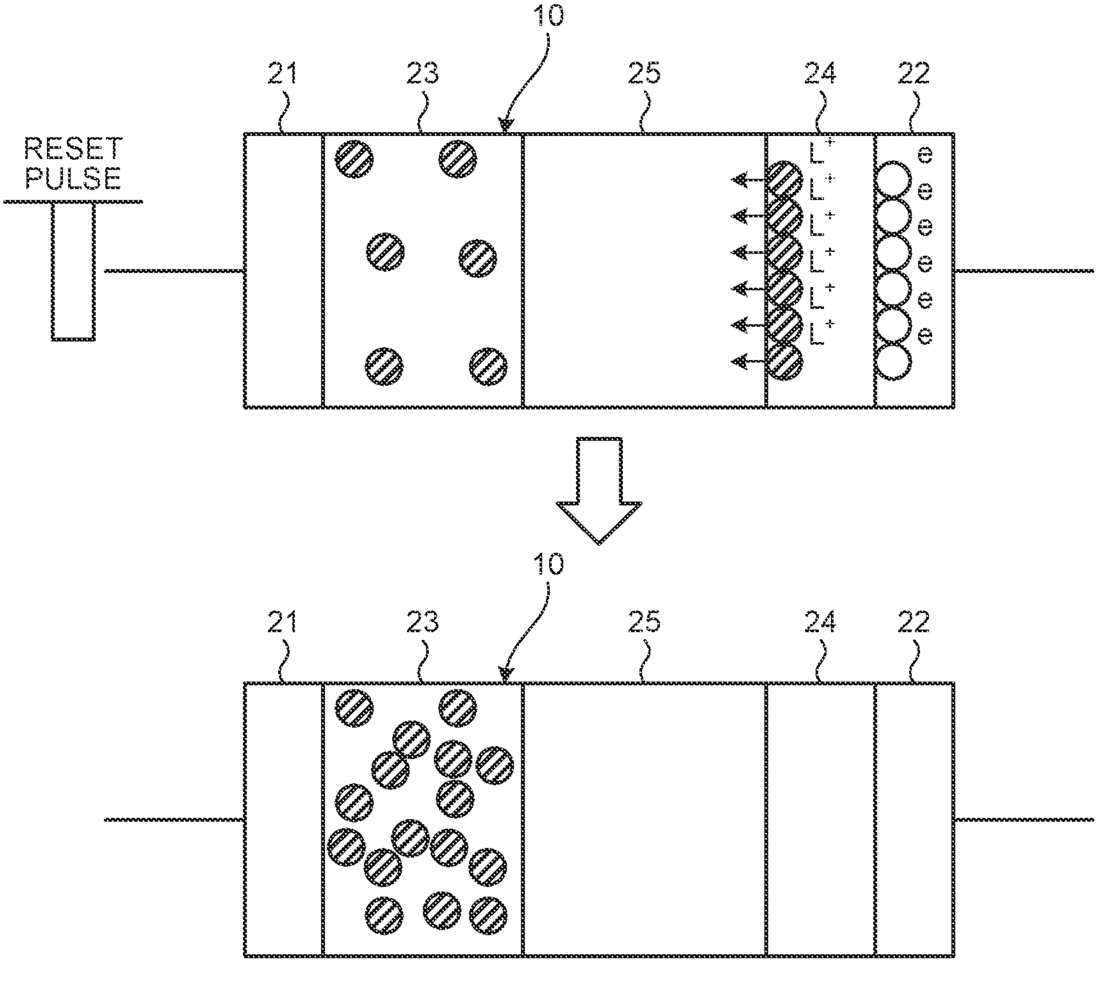
FIG. 7 is a diagram illustrating a state of a variable resistance element when a reset pulse is applied.

FIG. 7 is a diagram illustrating a state of pie variable resistance element 10 when a reset pulse is applied.

When changing the variable resistance element 10 to be in the high resistance state, the circuits serving to control the variable resistance element 10 applies, to the first electrode 21, a reset pulse of a negative voltage lower than the second electrode 22. Note that applying, to the first electrode 21, a reset pulse of a negative voltage lower than the second electrode 22 is similar to applying, to the second electrode 22, a reset pulse of a positive voltage higher than the first electrode 21.

The lithium ions contained in the second transition metal compound layer 24 move to the first transition metal compound layer 23 through the lithium ion conductor layer 25 due to the electric field generated by the reset pulse. Then, the second transition metal compound layer 24 changes from a state containing lithium ions to a state not containing lithium ions, entering a state of not being able to take in electrons from the second electrode 22. This changes the second transition metal compound layer 24 from a conductor to an insulator. This makes it possible to change the variable resistance element 10 to a high resistance state.

Figure 8:
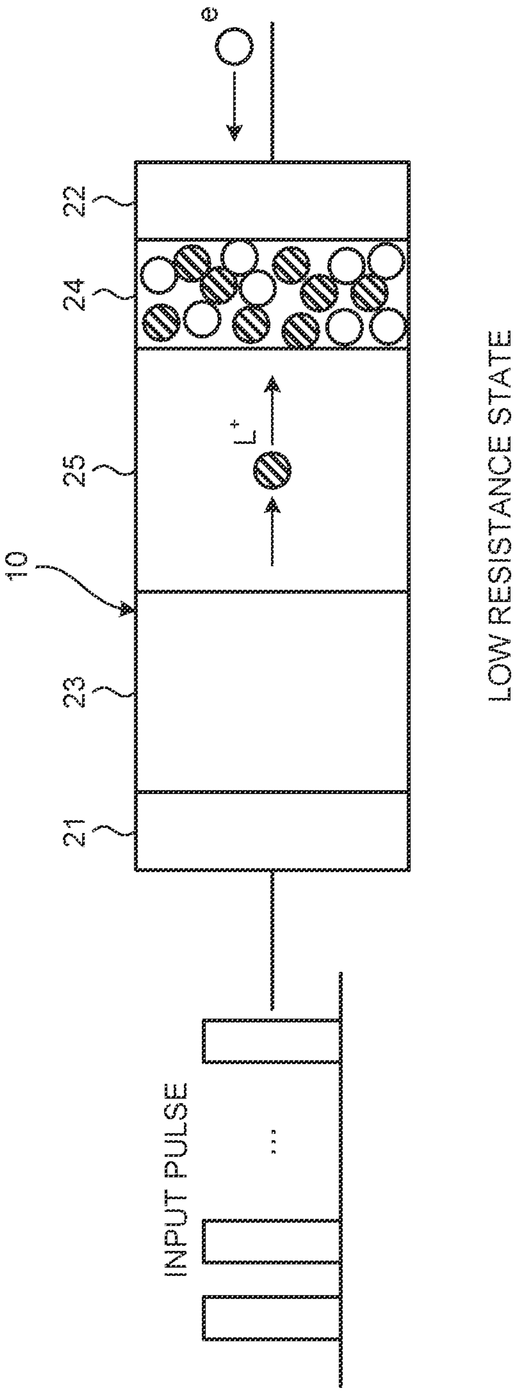
FIG. 8 is a diagram illustrating a state of a variable resistance element when an input pulse is applied.

FIG. 8 is a diagram illustrating a state of the variable resistance element 10 when an input pulse is applied in a low resistance state.

When the circuit including the variable resistance element 10 reads the state of the variable resistance element 10 in the low resistance state, or when using the variable resistance element 10 as a resistor, the circuit applies, to the first electrode 21, an input pulse having a positive voltage higher than the second electrode 22. Note that applying, to the first electrode 21, an input pulse having a positive voltage higher than the second electrode 22 is similar to applying, to the second electrode 22, an input pulse having a negative voltage lower than the first electrode 21.

The lithium ions contained in the first transition metal compound layer 23 move to the second transition metal compound layer 24 while passing through the lithium ion conductor layer 25 due to the electric field generated by the input pulse. When lithium ions arrive at the second transition metal compound layer 24, the second transition metal compound layer 24 takes in electrons from the second electrode 22 because the second transition metal compound layer 24 contains a sufficient amount of lithium ions and electrons in the lattice interstices. As a result, electric current can flow in the variable resistance element 10 being in the low resistance state when an input pulse is applied.

In contrast, in the case of the high resistance state, the second transition metal compound layer 24 does not contain a sufficient amount of lithium ions in the lattice interstices. Therefore, even when lithium ions arrive at the second transition metal compound layer 24 due to the electric field generated by the input pulse, the second transition metal compound layer 24 cannot take in electrons from the second electrode 22. As a result, electric current cannot flow in the variable resistance element 10 being in the high resistance state when an input pulse is applied.

The amount of lithium ion charge contained in the first transition metal compound layer 23 has an upper limit. For example, the amount of lithium ion charge that can be contained in $TiO_2$ having a size of 100×100×100 $nm^3$ is $1.5\times1.0^{-11}$ coulombs. For this reason, the variable resistance element 10 including the first transition metal compound layer 23 containing $TiO_2$ having such a size as a base material can only pass electric current pulse of 1 nA as small as about $1.5\times10^4$ times with a time width of 1 μs. Therefore, the circuit serving to control the variable resistance element 10 may execute control for reading the state of the variable resistance element 10 so as not to exceed the upper limit of the electric current that can be passed through the variable resistance element 10.

Figure 9:
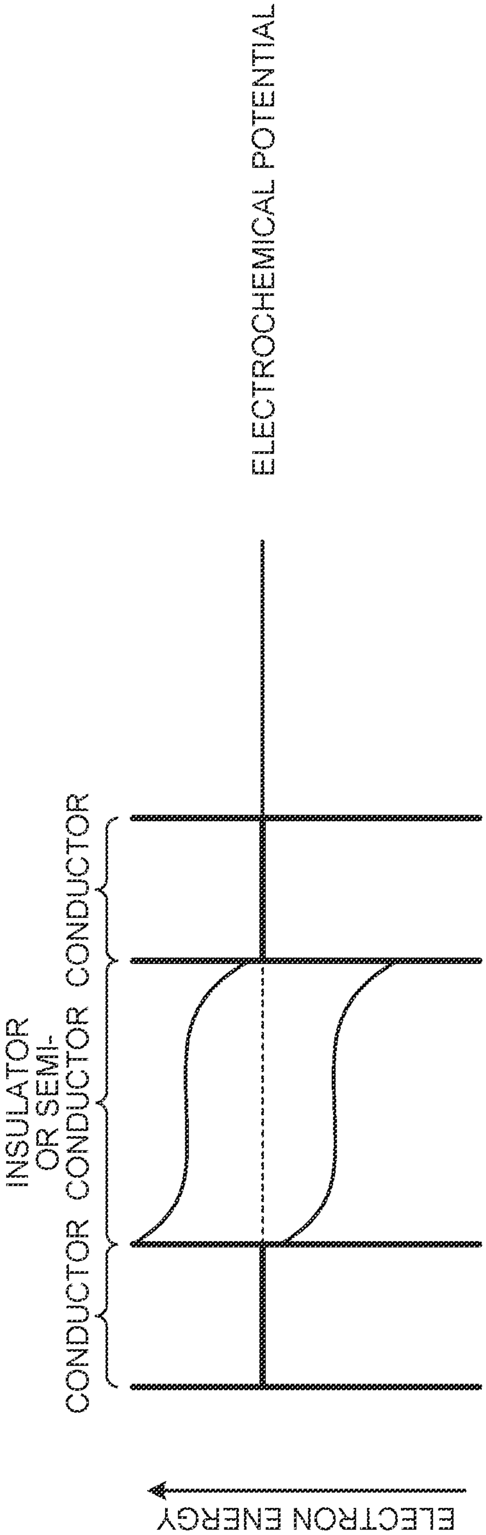
FIG. 9 is a view illustrating a Schottky barrier between a conductor and a material being an insulator or a semiconductor.
Figure 10:
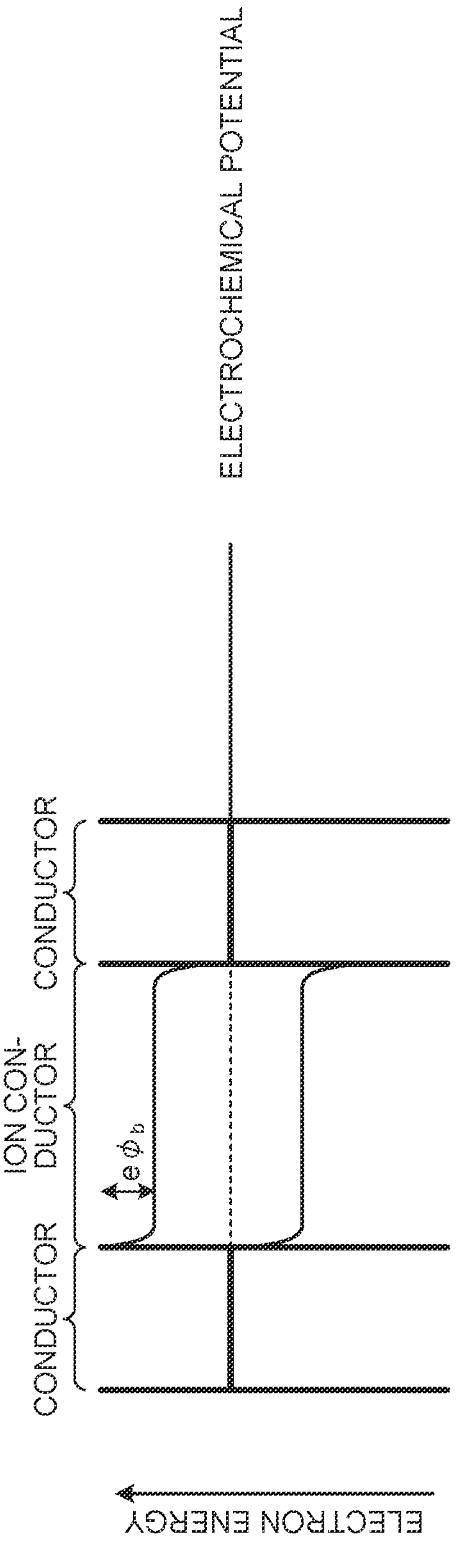
FIG. 10 is a view illustrating a Schottky barrier between a conductor and an ion conductor.

FIG. 9 is a view illustrating a Schottky barrier between a conductor and a material being an insulator or a semiconductor. FIG. 10 is a view illustrating a Schottky barrier between a conductor and an ion conductor.

Another factor for determining the resistance value in the low resistance state is interface resistance between the first transition metal compound layer 23 and the lithium ion conductor layer 25 and between the second transition metal compound layer 24 and the lithium ion conductor layer 25. The interface resistance is often structurally sensitive, and is desirably as small as possible. It is known from previous studies on lithium ion batteries that the interface resistance depends on the cleanliness of the interface, the crystallinity of the solid electrolyte, the orientation of the positive and negative electrodes, and the like. Furthermore, as described below, it is considered that there is also an effect of Schottky interface resistance that depends on a difference between the Fermi level of the lithium ion conductor layer 25 and the respective Fermi levels of the first transition metal compound layer 23 and the second transition metal compound layer 24.

As illustrated in FIG. 9, a Schottky barrier is formed between a conductor such as metal having high conductivity and a material being an insulator or a semiconductor. Here, in the case of an ion conductor that can electronically contain mobile ions even though it is an insulator, the electric field in the Schottky barrier is shielded by the mobile ions, leading to the great reduction in the thickness of the Schottky barrier. However, shielding by mobile ions is not perfect due to repulsive force between ions, and the like, resulting in remaining band bending caused by a Schottky barrier as illustrated in FIG. 10. Band bending caused by the Schottky barrier works as resistance in ion conduction. A magnitude $e\phi_b$ of band bending on the positive electrode side illustrated in FIG. 10 is equal to a difference between the Fermi level of the positive electrode and the Fermi level of the ion conductor. Here, e is an elementary charge, and $\phi_b$ is an electrostatic potential. The potential change considered to be caused by hand bending has also been experimentally reported by Non-Patent Literature 2: Yuki Nomura, Kazuo Yamamoto, Tsukasa Hirayama, Satoru Ouchi, Emiko Igaki, Koh Saitoh, "Direct Observation of a Li-Ionic Space-Charge Layer Formed at an Electrode/Solid-Electrolyte Interface", Wiley Online Library, 5292, 2019 February 2019, for example.

Figure 11:
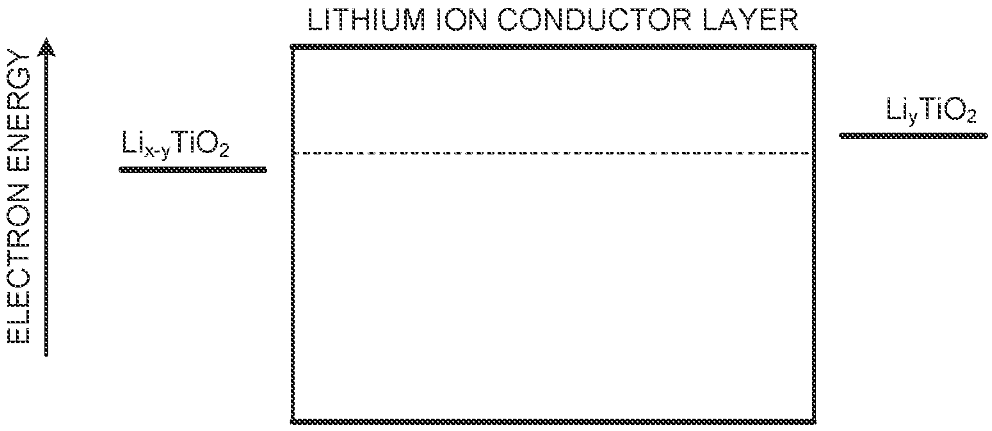
FIG. 11 is a view illustrating a Schottky barrier in a case where Fermi levels are different.
Figure 12:
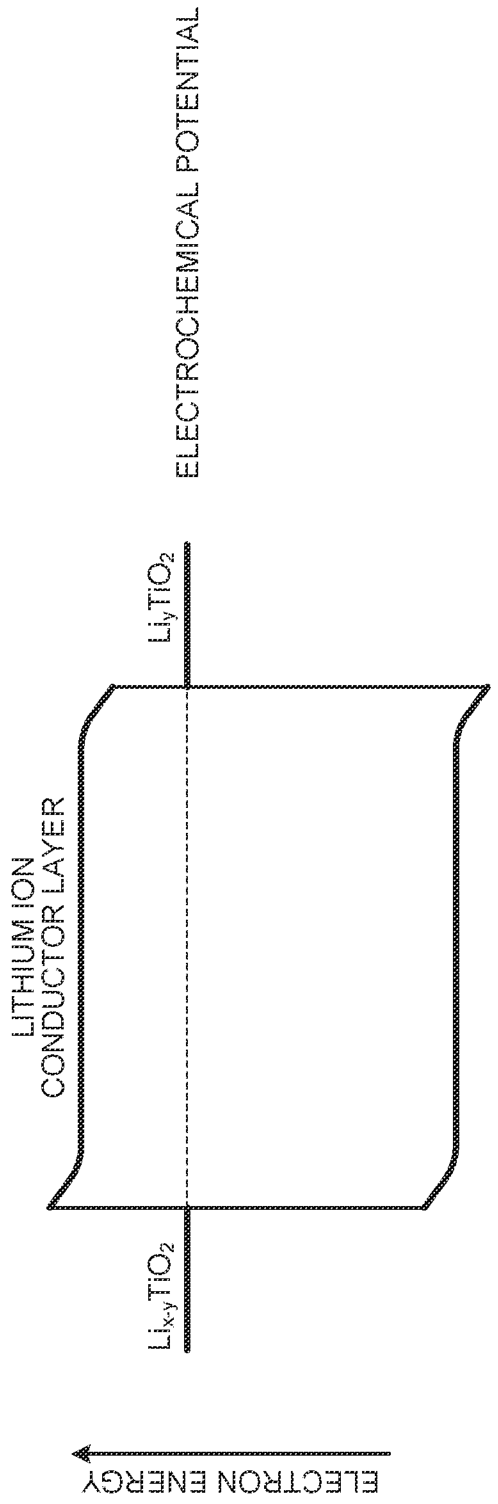
FIG. 12 is a view illustrating a Schottky barrier in a case where Fermi levels are the same.

FIG. 11 is a diagram illustrating a Schottky barrier in a case where the Fermi level of the first transition metal compound layer 23 is different from the Fermi level of the lithium ion conductor layer 25. FIG. 12 is a diagram illustrating a Schottky barrier in a case where the Fermi level of the first transition metal compound layer 23 is equal to the Fermi level of the lithium ion conductor layer 25.

In the case of a lithium ion battery, the Fermi levels of the positive and negative electrodes have a difference of several electron volts. Therefore, in the case of a lithium ion battery, it is difficult to reduce two Schottky interface resistance levels existing on the positive electrode side and the negative electrode side under a single ion conductor. In contrast, in the lithium ion conductor layer 25 according to the present embodiment, as illustrated in FIG. 11, an interface is formed between two material having almost the same Fermi level, namely, $Li_{x-y}TiO_2$ and $Li_yTiO_2$. Therefore, by selecting, in the variable resistance element 10, a solid electrolyte having no or a small difference from the Fermi levels of $Li_{x-y}TiO_2$ and $Li_yTiO_2$ as the lithium ion conductor layer 25, it is possible to reduce the band bending at the two interfaces and lower the Schottky interface resistance as illustrated in FIG. 12. Alternatively, it is also allowable, in the variable resistance element 10, to first select a solid electrolyte to be used as the lithium ion conductor layer 25, and then select a transition metal compound such as a transition metal oxide having no or small difference from the Fermi level of the solid electrolyte.

In this manner, it is preferable that, in the variable resistance element 10, the Fermi level of the first transition metal compound layer 23 and the second transition metal compound layer 24 and the Fermi level of the lithium ion conductor layer 25 have no or small difference. For example, in the variable resistance element 10, the difference between the Fermi level of the lithium ion conductor layer 25 and the respective Fermi levels of the first transition metal compound layer 23 and the second transition metal compound layer 24 may be 1 electron volt or less. This makes it possible for the variable resistance element 10 to lower the Schottky interface resistance and reduce the resistance value in the low resistance state.

First Modification of First Embodiment

Figure 13:
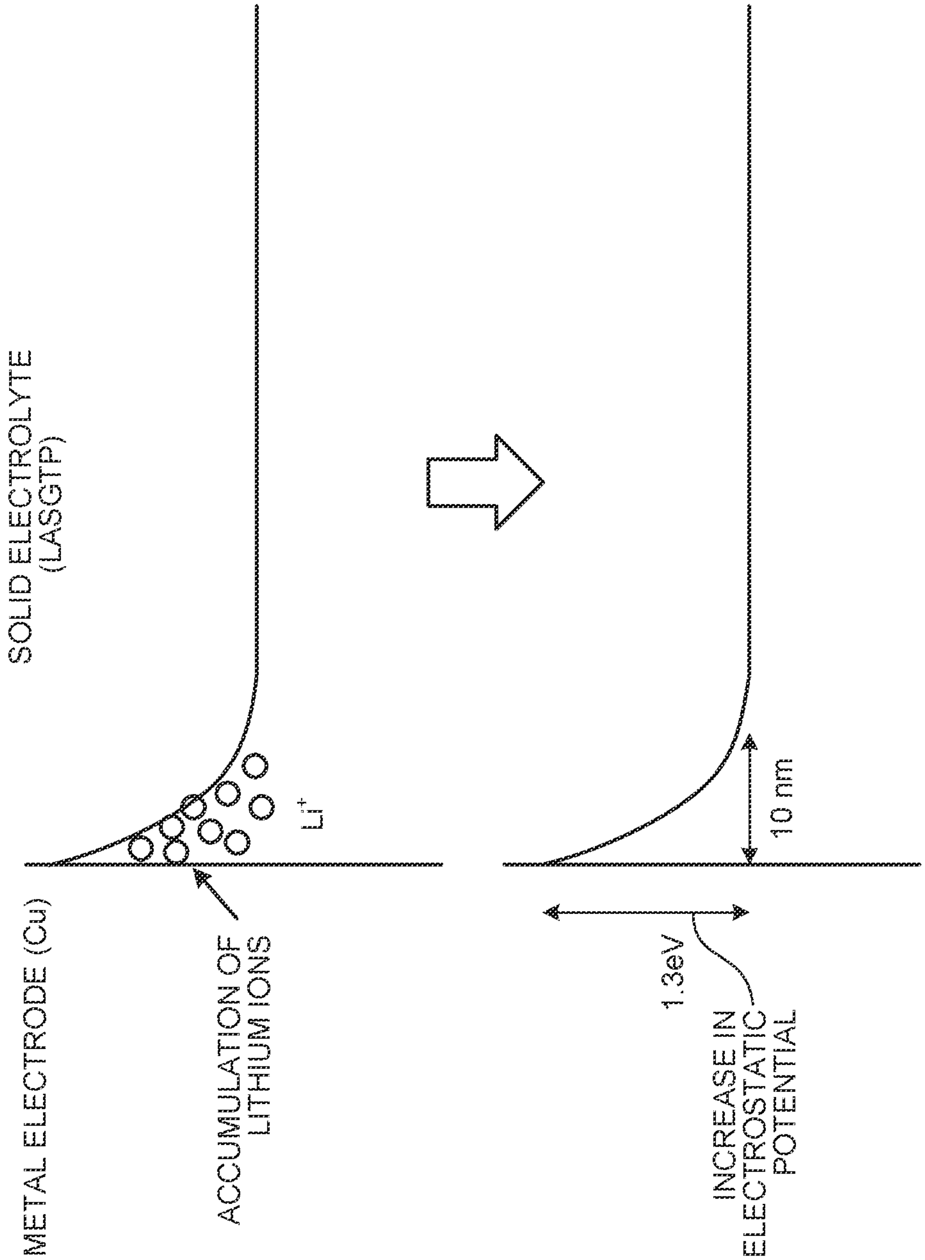
FIG. 13 is a diagram illustrating a concentration distribution and potential distribution of lithium ions at the interface.

FIG. 13 is a diagram illustrating a concentration distribution and potential distribution of lithium ions at the interface between a metal electrode (Cu) and solid electrolyte (LASGTP).

Non-Patent Literature 2 (Yuki Nomura, Kazuo Yamamoto, Tsukasa Hirayama, Satoru Ouchi, Emiko Igaki, Koh Saitoh, "Direct Observation of a Li-Ionic Space-Charge Layer Formed at an Electrode/Solid-Electrolyte Interface", Wiley Online Library, 5292, 2019 February 2019) reports that observation of lithium ion concentration distribution at the interface between the metal electrode (Cu) and the solid electrolyte (LASGTP) has revealed high concentration accumulation of $Li^+$ in a solid electrolyte (LASGTP) region close to the metal electrode (Cu). Non-Patent Literature 2 also reports, from the observation result, that 1.3 eV potential change has occurred and electrostatic potential has increased in a region about 10 nm from the interface.

The variable resistance element 10 according to the present embodiment preferably has a further lowered resistance value in the low resistance state. In order to lower the resistance value in the low resistance state in the variable resistance element 10, it is conceivable to lower a bulk resistivity regarding ion conduction in the lithium ion conductor layer 25. However, lowering the bulk resistivity regarding ion conduction causes Schottky interface resistance as illustrated in FIG. 13 in the lithium ion conductor layer 25.

Figure 14:
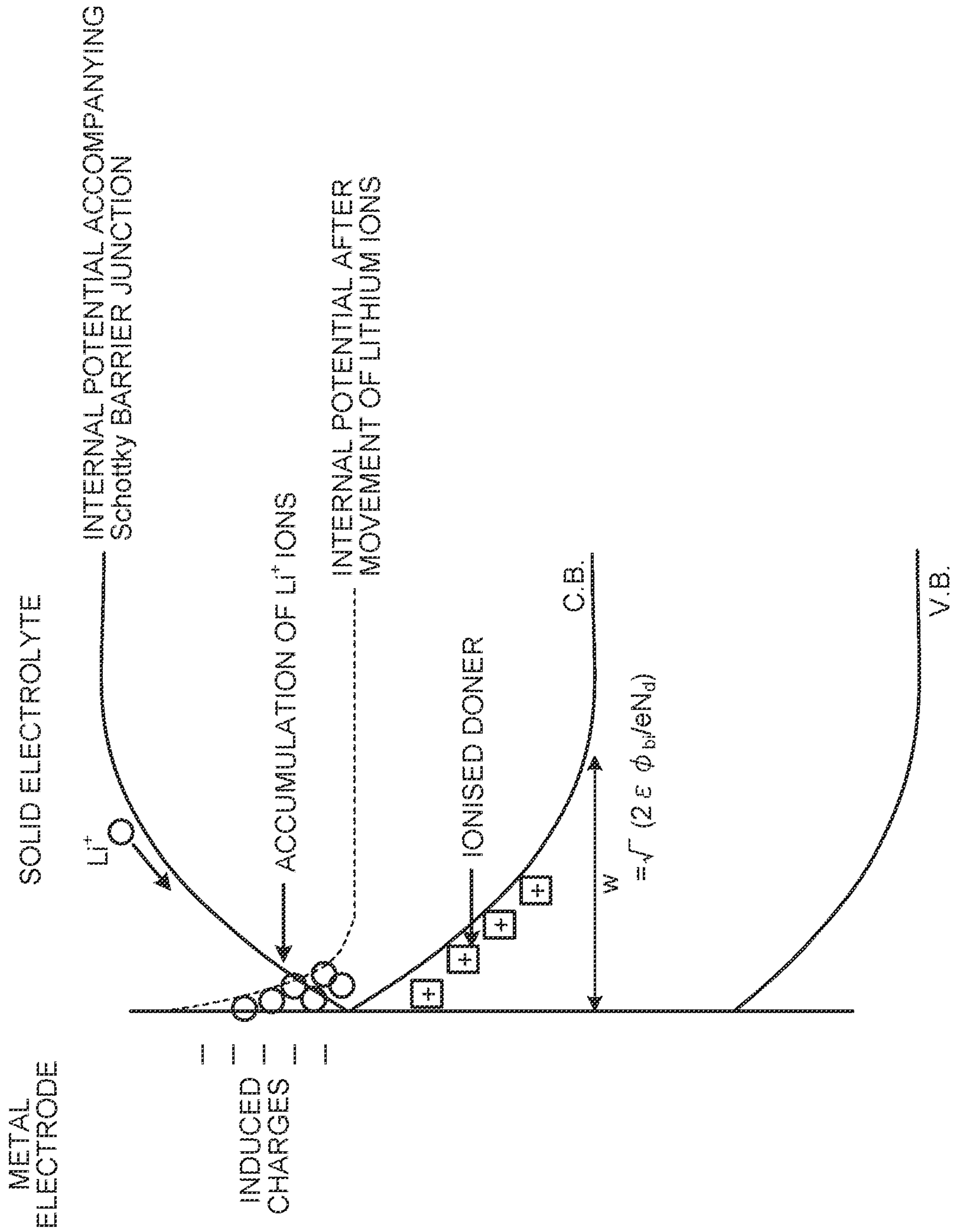
FIG. 14 is a diagram illustrating an example of potential in the neighborhood of the interface.

FIG. 14 is a diagram illustrating an example of internal potential accompanying the Schottky barrier junction in the neighborhood of an interface between the metal electrode and the solid electrolyte and internal potential after movement of the lithium ions.

Based on the report of Non-Patent Literature 2, it is estimated that defect existing near the interface functions as a donor in the variable resistance element 10 and this leads to occurrence of electron carriers in the lithium ion conductor layer 25 to form the Schottky barrier junction. It is also estimated that the occurrence of electron carriers results in occurrence of internal electric field in the neighborhood of the interface in the lithium ion conductor layer 25, and that the internal electric field moves the lithium ions to cause the accumulation of lithium ions at the interface portion. The accumulation of the lithium ions in the neighborhood of the interface is estimated to cause the Schottky interface resistance in the lithium ion conductor layer 25.

Figure 15:
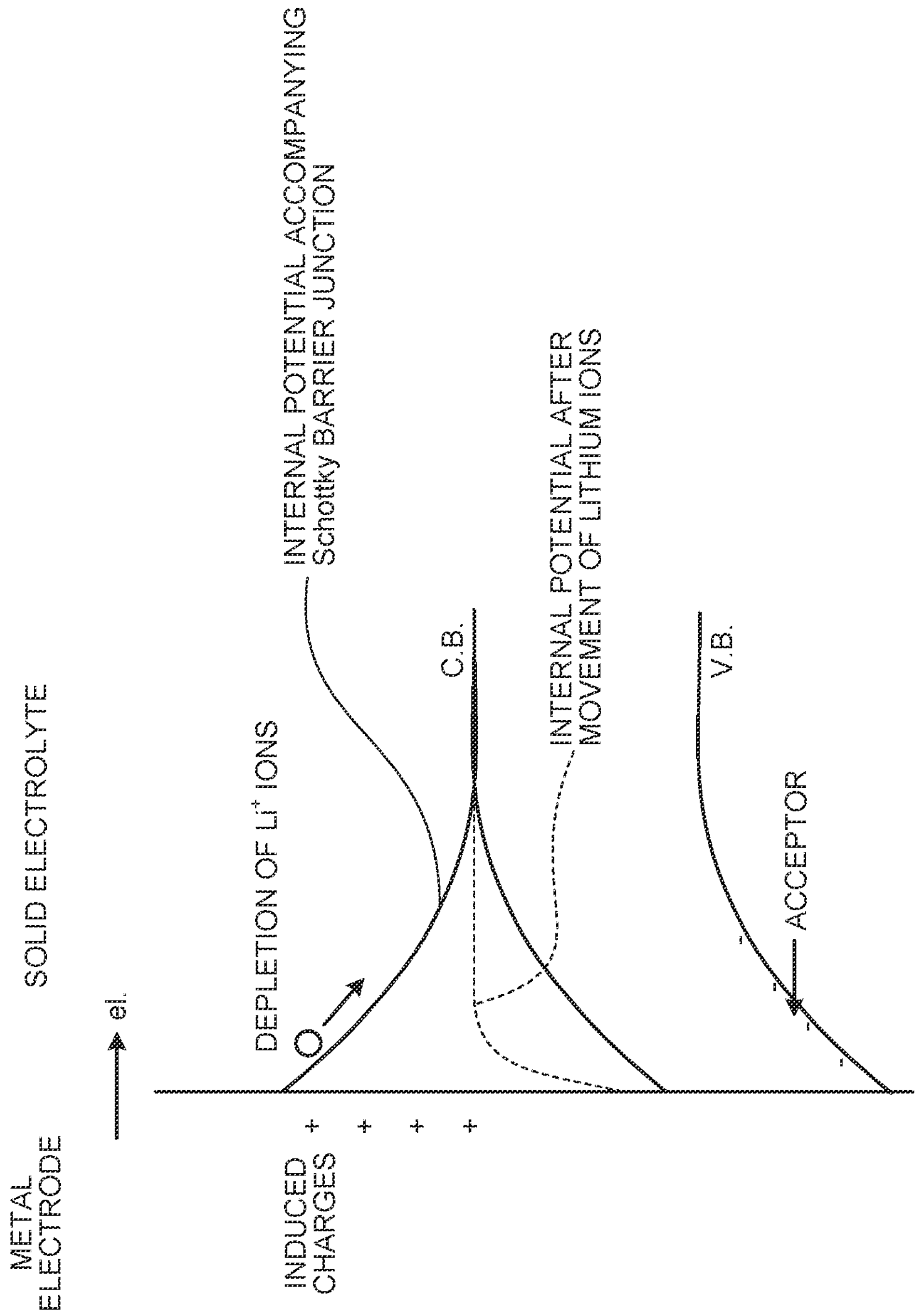
FIG. 15 is a diagram illustrating another example of potential in the neighborhood of the interface.

FIG. 15 is a diagram illustrating another example of internal potential accompanying the Schottky barrier junction in the neighborhood of the interface between the metal electrode and the solid electrolyte and internal potential after movement of the lithium ions.

There is a possibility that movement of the lithium ions by the internal electric field causes an occurrence of depletion of lithium ions at the interface portion. Such depletion of lithium ions at the interface portion may cause Schottky interface resistance in the lithium ion conductor layer 25, though the mechanism of occurrence of space charge is not known at the current moment.

Figure 16:
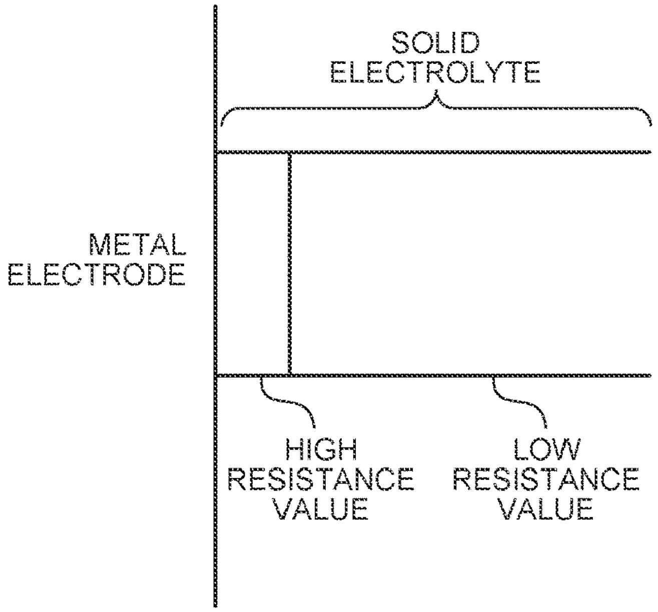
FIG. 16 is a diagram illustrating a metal electrode, and a solid electrolyte having a high resistivity at the interface.

FIG. 16 is a diagram illustrating the metal electrode, and the solid electrolyte having a high resistivity regarding electron conduction in the neighborhood of the interface.

It is estimated that the solid electrolyte can suppress occurrence of electron carriers by using a material having a high resistivity regarding electron conduction for the portion in the neighborhood of the interface with the metal electrode. Such a solid electrolyte is estimated to suppress the movement of lithium ions and suppress accumulation of lithium ions and depletion of lithium ions at the interface. That is, the solid electrolyte is estimated to be able reduce the interface resistance by increasing the resistance value regarding electron conduction in the neighborhood of the interface.

Accordingly, it is estimated that, by using an insulator as a material of the portion in the neighborhood of the interface with the metal electrode, the solid electrolyte can suppress the accumulation of the lithium ions and depletion of lithium ions in the neighborhood of the interface, making it possible to reduce the interface resistance.

In an actual band model, however, the insulator and the semiconductor are continuously formed with no interface. The insulator and the semiconductor are practically different and are distinguished from each other in that whether they have a shallow donor level (for example, 0.5 eV or less) that supplies electron carriers. When a shallow donor level exists, the material is a semiconductor; when there is no shallow donor level, the material is an insulator. The presence or absence of a shallow donor level depends on the bandgap of the crystal. The crystal having a handgap wider than 5 eV has no shallow donor level. The resistivity regarding electron conduction in the crystal having no shallow donor level is $10^8$ Ωcm or more.

Therefore, it is estimated that when the resistivity regarding electron conduction in the neighborhood of the interface in the solid electrolyte is $10^8$ Ωcm or more, it is possible to suppress accumulation of lithium ions and depletion of lithium ions in the neighborhood of the interface, making it possible to reduce the interface resistance.

A material with a narrow bandgap tends to have high electronic polarizability. In addition, a solid electrolyte with a narrow bandgap tends to have high ionic conductivity. A solid electrolyte with a narrow bandgap is likely to have a shallow donor level and likely to generate electron carriers. In contrast, a material with a wide bandgap tends to have low electronic polarizability. In addition, a solid electrolyte with a wide bandgap tends to have low ionic conductivity. That is, a solid electrolyte with a wide bandgap is not likely to have a shallow donor level and not likely to generate electron carriers.

For example, a sulfide-based solid electrolyte or a specific type of oxide-based solid electrolyte has ionic conductivity of about $10^{-2}$ S/cm or less and $10^{-4}$ S/cm or more, indicating high ionic conductivity. However, such a solid electrolyte has a bandgap about 3 eV or more and 4 eV or less, and this narrow bandgap is likely to lead to generation of electron carriers. On the other hand, for example, solid electrolytes of many types of oxide based or phosphorus nitrogen oxide based have ionic conductivity of about $10^{-5}$ S/cm or less and $10^{-6}$ S/cm or more, indicating low ionic conductivity. However, such solid electrolytes of many types of oxide based or phosphorus nitrogen oxide based have a bandgap of 5 eV or more, and this wide bandgap is unlikely to lead to generation of electron carriers. In this manner, a solid electrolyte has a tendency that, the higher the ionic conductivity, the lower the resistivity regarding electron conduction.

Consequently, regarding the solid electrolyte, it is estimated that, the lower the ionic conductivity in the neighborhood of the interface, the more the level of suppression of accumulation of lithium ions and depletion of lithium ions in the neighborhood of the interface, leading to lower interface resistance.

The variable resistance element 10 according to the first modification of the first embodiment utilizes the characteristics described above to lower the resistance value in the low resistance state. Hereinafter, a configuration of the variable resistance element 10 according to the first modification of the first embodiment will be described.

Figure 17:
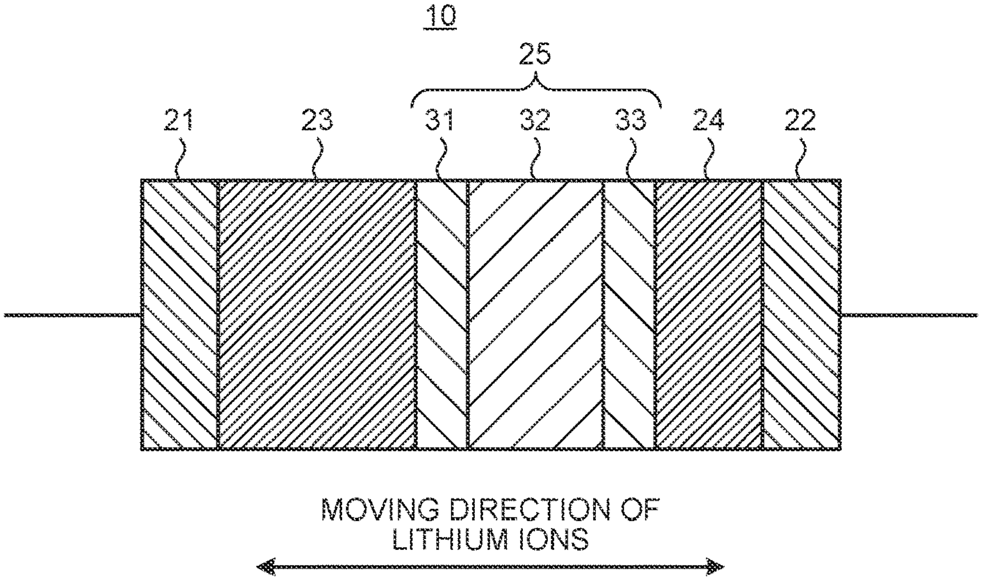
FIG. 17 is a diagram illustrating a configuration of a variable resistance element according to a first modification of the first embodiment.

FIG. 17 is a diagram illustrating a configuration of the variable resistance element 10 according to the first modification of the first embodiment.

The lithium ion conductor layer 25 according to the first modification includes a first electrolyte layer 31, a second electrolyte layer 32, and a third electrolyte layer 33. The lithium ion conductor layer 25 according to the first modification has a layer structure formed by the first electrolyte layer 31, the second electrolyte layer 32, and the third electrolyte layer 33 in this order from the first transition metal compound layer 23 side.

Specifically, the first electrolyte layer 31 is connected to the first transition metal compound layer 23. The third electrolyte layer 33 is connected to the second transition metal compound layer 24. In addition, the second electrolyte layer 32 is included between the first electrolyte layer 31 and the third electrolyte layer 33. Moreover, for example, the first electrolyte layer 31, the second electrolyte layer 32, and the third electrolyte layer 33 have the same shape and size of a junction in a plane perpendicular to the lithium ion moving direction (stacking direction). Incidentally, there may be a hole in a part of the junction of the first electrolyte layer 31 and the second electrolyte layer 32 and there is no need to have a configuration in which the whole junction is connected to the first transition metal compound layer 23 or the second transition metal compound layer 24.

Here, the first electrolyte layer 31 and the third electrolyte layer 33 each have a resistivity higher than the resistivity of the second electrolyte layer 32. For example, the resistivity regarding electron conduction in the second electrolyte layer 32 is lower than $10^8$ Ωm. For example, the resistivity regarding electron conduction in each of the first electrolyte layer 31 and the third electrolyte layer 33 is $10^8$ Ωm or more. In addition, ionic conductivity in each of the first electrolyte layer 31 and the third electrolyte layer 33 may be lower than that in the second electrolyte layer 32.

Such a lithium ion conductor layer 25 according to the first modification is capable of increasing the ionic conductivity in the second electrolyte layer 32. In addition, the lithium ion conductor layer 25 according to the first modification is capable of lowering interface resistance on the junction with the first transition metal compound layer 23 as well as lowering interface resistance on the junction with the second transition metal compound layer 24. This makes it possible for such a lithium ion conductor layer 25 according to the first modification to reduce the resistance value of the bulk resistance while reducing the Schottky interface resistance, leading to achievement of reduction of the resistance value in the low resistance state.

In addition, in the lithium ion conductor layer 25 according to the first modification, the film thickness of each of the first electrolyte layer 31 and the third electrolyte layer 33 in the stacking direction may be smaller than the film thickness of the second electrolyte layer 32 in the stacking direction. This makes it possible for the lithium ion conductor layer 25 according to the first modification to reduce the film thickness of each of the first electrolyte layer 31 and the third electrolyte layer 33, which has high ionic conductivity, leading to achievement of further reduction of the resistance value in the low resistance state.

FIG. 18 is a diagram illustrating a calculation example of resistance values in individual portions in the high resistance state in the variable resistance element 10 according to the first modification. FIG. 19 is a diagram illustrating a calculation example of resistance values in individual portions in the low resistance state in the variable resistance element 10 according to the first modification.

Regarding the variable resistance element 10, the ratio of the resistance value in the high resistance state to the resistance value in the low resistance state (that is, a resistance change ratio) is desirably high.

In a case where the lithium ion conductor layer 25 is formed with the first electrolyte layer 31, the second electrolyte layer 32, and the third electrolyte layer 33, the resistance value in the low resistance state and the resistance value in the high resistance state individually change in accordance with the ratio (bulk resistance ratio), which is the resistance value of the hulk resistance of the first electrolyte layer 31 to the resistance value of the bulk resistance of the second electrolyte layer 32. Note that it is assumed here that the resistance value of the bulk resistance of the first electrolyte layer 31 is equal to the resistance value of the bulk resistance of the third electrolyte layer 33.

In the calculated values illustrated in FIGS. 18 and 19. resistance values of individual portions have been given as follows.

The resistance value for the first electrode 21 and the second electrode 22 is set to 1Ω. The resistance value for the first transition metal layer 23 is set to 10Ω. For the second transition metal layer 24, the resistance value in the high resistance state (resistance value when $Li_0TiO_2$=$TiO_2$) is set to $1.00\times10^{10}$Ω and the resistance value in the high resistance state is set to $1\times10^1$Ω.

In addition, the resistance value of the interface resistance for $TiO_2$ in the first electrolyte layer 31 and the third electrolyte layer 33 is set to $1.00\times10^{10}$Ω. The resistance value of the interface resistance for $TiO_2$ in the second electrolyte layer 32 is set to $1.00\times10^{12}$Ω. The resistance value of the bulk resistance in the second electrolyte layer 32 is set to a fixed value $1.00\times10^{11}$Ω.

Furthermore, the resistance value of the bulk resistance in the first electrolyte layer 31 and the third electrolyte layer 33 is varied to ×0 (namely, $0.00\times10^{11}$Ω) ×1 (namely, $1.00\times10^{11}$Ω), ×2 (namely, $2.00\times10^{11}$Ω, ×5 (namely, $5.00\times10^{11}$Ω), ×10 (namely, $1.00\times10^{12}$Ω), ×20 (namely, $2.00\times10^{12}$Ω), and ×50 (namely, $5.00\times10^{12}$Ω), with respect to the resistance value of the bulk resistance in the second electrolyte layer 32. Note that ×0 refers to the case where the lithium ion conductor layer 25 does not include the first electrolyte layer 31 or the third electrolyte layer 33 and the second electrolyte layer 32 is directly connected to $LiTiO_2$.

As a result of calculation based on the setting described above, when the bulk resistance ratio of the first electrolyte layer 31 to the second electrolyte layer 32 is ×0, a combined resistance value of the variable resistance element 10 in the high resistance state is calculated as $2.11\times10^{12}$Ω. In addition, when ×0, a combined resistance value of the variable resistance element 10 in the low resistance state is calculated as $2.1\times10^{12}$Ω.

Moreover, when the bulk resistance ratio is ×1, a combined resistance value of the variable resistance element 10 in the high resistance stale is calculated as $3.30\times10^{11}$Ω. In addition, when ×1, a combined resistance value of the variable resistance element 10 in the low resistance state is calculated as $3.2\times10^{11}$Ω.

Moreover, when the bulk resistance ratio is ×2, a combined resistance value of the variable resistance element 10 in the high resistance state is calculated as $5.30\times10^{11}$Ω. In addition, when ×2, a combined resistance value of the variable resistance element 10 in the low resistance state is calculated as $5.2\times10^{11}$Ω.

Moreover, when the bulk resistance ratio is ×5, a combined resistance value of the variable resistance element 10 in the high resistance state is calculated as $1.13\times10^{12}$Ω. In addition, when ×5, a combined resistance value of the variable resistance element 10 in the low resistance state is calculated as $1.12\times10^{12}$Ω.

Moreover, when the bulk resistance ratio is ×10, a combined resistance value of the variable resistance element 10 in the high resistance state is calculated as $2.13\times10^{12}\Omega$. In addition, when ×10, a combined resistance value of the variable resistance element 10 in the low resistance state is calculated as $2.12\times10^{12}\Omega$.

Moreover, when the bulk resistance ratio is ×20, a combined resistance value of the variable resistance element 10 in the high resistance state is calculated as $4.13\times10^{12}\Omega$. In addition, When ×20, a combined resistance value of the variable resistance element 10 in the low resistance state is calculated as $4.12\times10^{12}\Omega$.

Moreover, when the bulk resistance ratio is ×50, a combined resistance value of the variable resistance element 10 in the high resistance state is calculated as $1.01\times10^{13}\Omega$. In addition, When ×50, a combined resistance value of the variable resistance element 10 in the low resistance state is calculated as $1.012\times10^{13}\Omega$.

Figure 20:
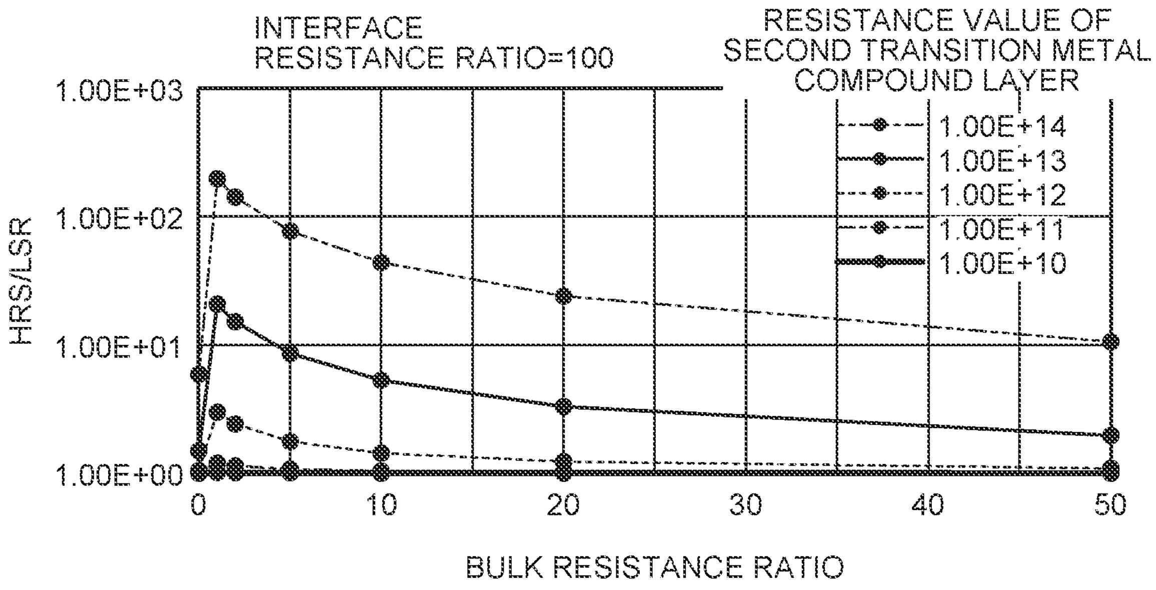
FIG. 20 is a diagram illustrating a resistance charge ratio when an interface resistance ratio is ×100.
Figure 21:
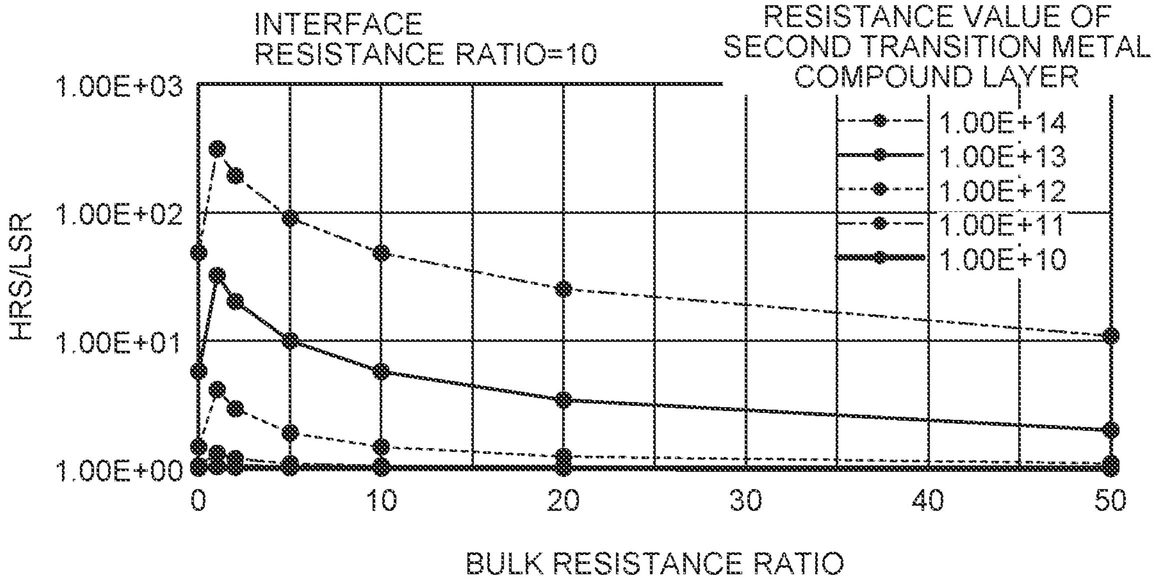
FIG. 21 is a diagram illustrating the resistance change ratio when the interface resistance ratio is ×10.
Figure 22:
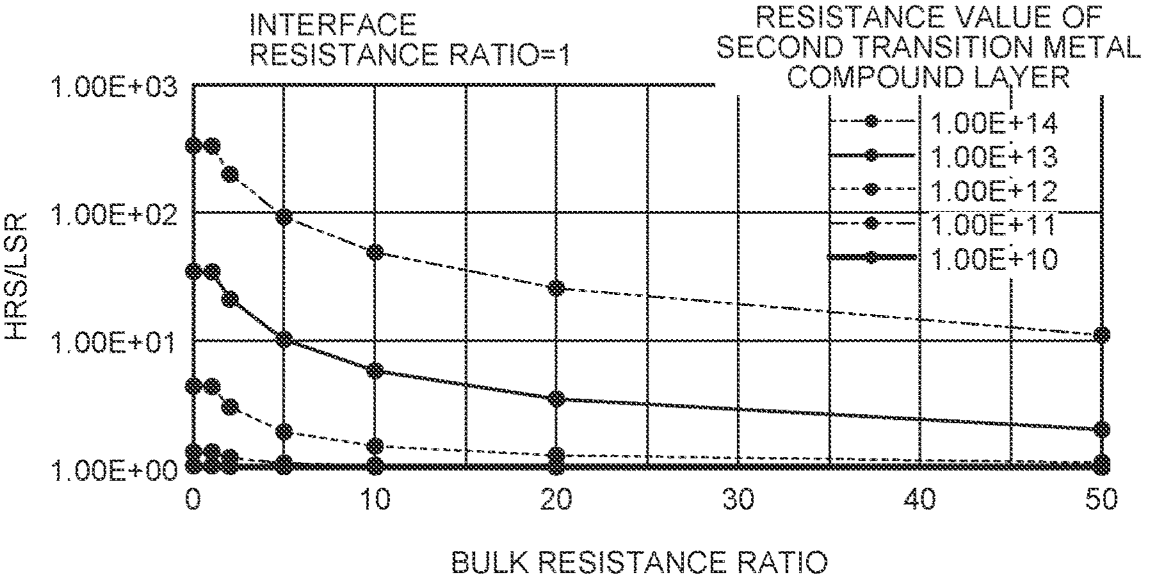
FIG. 22 is a diagram illustrating the resistance change ratio when the interface resistance ratio is ×1.

FIG. 20 is a diagram illustrating the resistance change ratio of the variable resistance element 10 according to the first modification of the first embodiment with respect to the bulk resistance ratio when the interface resistance ratio is ×100. FIG. 21 is a diagram illustrating the resistance change ratio of the variable resistance element 10 according to the first modification of the first embodiment with respect to the bulk resistance ratio when the interface resistance ratio is ×10. FIG. 22 is a diagram illustrating the resistance change ratio of the variable resistance element 10 according to the first modification of the first embodiment with respect to the bulk resistance ratio when the interface resistance ratio is ×1.

The resistance change ratio of the variable resistance element 10 represents a ratio HRS/LRS, that is, a ratio of the resistance value in the high resistance state to the resistance value in the low resistance state. The interface resistance ratio represents a ratio between the resistance value of the interface resistance for $TiO_2$ in the first electrolyte layer 31 and the third electrolyte layer 33, and the resistance value of the interface resistance for $TiO_2$ in the second electrolyte layer 32. The bulk resistance ratio represents a ratio of the bulk resistance in the first electrolyte layer 31 and the third electrolyte layer 33 to the bulk resistance in the second electrolyte layer 32.

In FIGS. 20, 21, and 22, a resistance change rate in individual cases where the resistance value of the second transition metal compound layer 24 in the high resistance state (that is the resistance value of $TiO_2$) is varied to $1.00\times10^{10}\Omega$, $1.00\times10^{11}\Omega$, $1.00\times10^{12}\Omega$, $1.00\times10^{13}\Omega$, and $1.00\times10^{14}\Omega$. The diagrams also indicate the resistance change rate (HRS/LRS) obtained in a case when individual conditions other that the resistance value of the second transition metal compound layer 24 in the high resistance state are the same as the conditions indicated in FIGS. 18 and 19.

Under the conditions in FIGS. 20, 21, and 22, the variable resistance element 10 according to the first modification of the first embodiment can increase the resistance change ratio (HRS/LRS) when the resistance value of the second transition metal compound layer 24 in the high resistance state is higher than the bulk resistance of the second electrolyte layer 32 by 10 times or more.

In addition, under the conditions in FIGS. 20, 21, and 22, the variable resistance element 10 cannot increase the resistance change ratio (HRS/LRS) when the interface resistance is higher than the bulk resistance of the second electrolyte layer 32 by 10 times or more.

In addition, under the conditions in FIGS. 20, 21, and 22, the variable resistance element 10 can increase the resistance change ratio (HRS/LRS) when the interface resistance ratio is about ×100. Conversely, under the conditions in FIGS. 20, 21, and 22, the variable resistance element 10 cannot improve the resistance change ratio (HRS/LRS) when the interface resistance ratio is ×1.

In addition, under the conditions in FIGS. 20, 21, and 22, the variable resistance element 10 has a change such that the higher the bulk resistance ratio, the more the resistance change rates (HRS/LRS) decreases.

As described above, the variable resistance element 10 according to the first modification of the first embodiment can improve the resistance change ratio of the variable resistance element 10 according to the conditions such as the settings of the interface resistance ratio, the bulk resistance ratio, or the resistance value of the second transition metal compound layer 24 in the high resistance state.

Second Modification of First Embodiment

Figure 23:
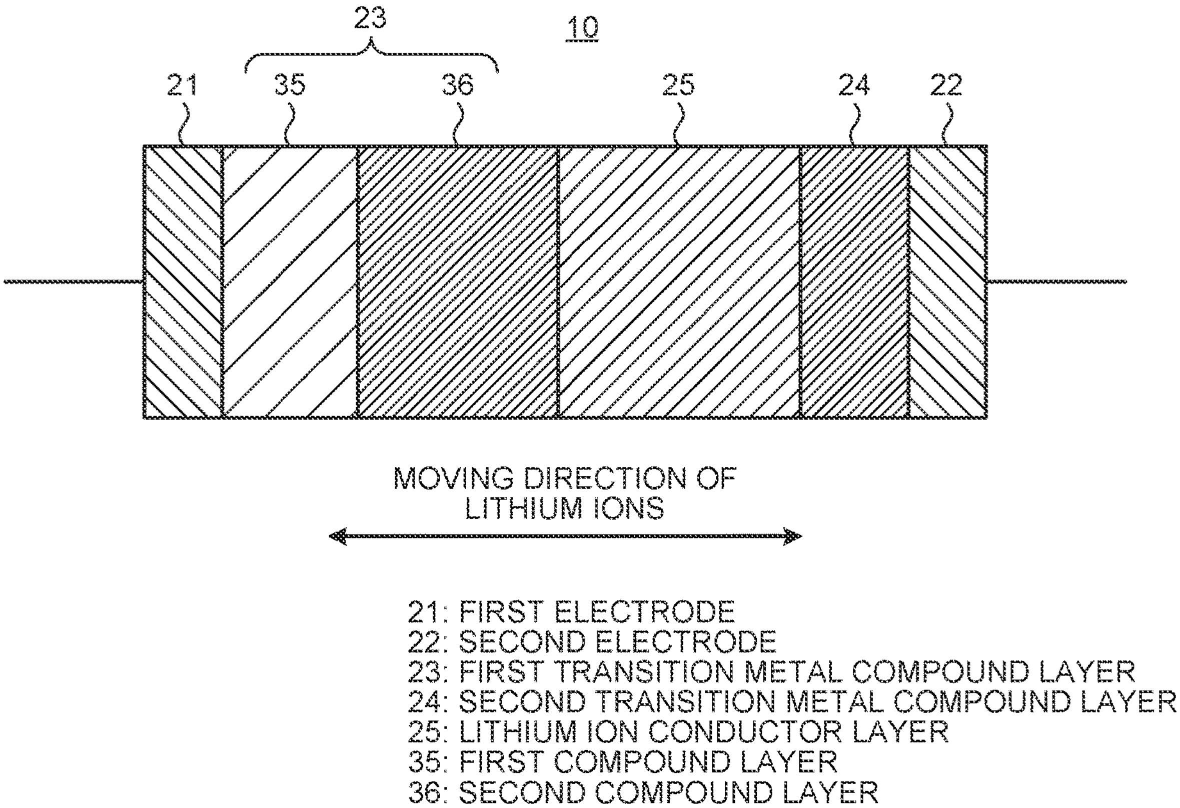
FIG. 23 is a diagram illustrating a configuration of a variable resistance element according to a second modification of the first embodiment.

FIG. 23 is a diagram illustrating a configuration of a variable resistance element 10 according to a second modification of the first embodiment.

A first transition metal compound layer 23 according to the second modification includes a first compound layer 35 and a second compound layer 36. The first transition metal compound layer 23 according to the second modification has a layer structure formed with the first compound layer 35 and the second compound layer 36 in this order from the first electrode 21 side.

That is, the first compound layer 35 is connected to the first electrode 21. The second compound layer 36 is connected to the lithium ion conductor layer 25. In addition, for example, the first compound layer 35 and the second compound layer 36 have the same shape and size of a junction in a plane perpendicular to the moving direction of lithium ions (stacking direction).

The first compound layer 35 is formed of $LiCoO_2$. The first compound layer 35 may be formed of $LiCoO_X$. In this case, X is an integer of 1 or more. The second compound layer 36 is formed of $TiO_2$.

The first compound layer 35 can supply lithium ions to lattice interstices of the second compound layer 36. With this configuration, the second compound layer 36 functions as $Li_{x-y}TiO_2$ or $Li_{x-y}TiO_X$ at the time of operation, even if the second compound layer 36 is $TiO_2$ or $TiO_x$ at the initial state in manufacturing.

In the second modification, the second transition metal compound layer 24 is formed of the same material as the material of the second compound layer 36. This causes the variable resistance element 10 according to the second modification to have a configuration that the lithium ion conductor layer 25 is sandwiched between the same materials. in the variable resistance element 10 according to the second modification, the electrolyte is sandwiched between the same materials, making it possible to suppress occurrence of electromotive force and possible to function as resistance.

Second Embodiment

Next, a storage device 40 according to a second embodiment will be described. According to the storage device 40 of the second embodiment, the variable resistance element 10 described in the first embodiment is used as a storage element.

Figure 24:
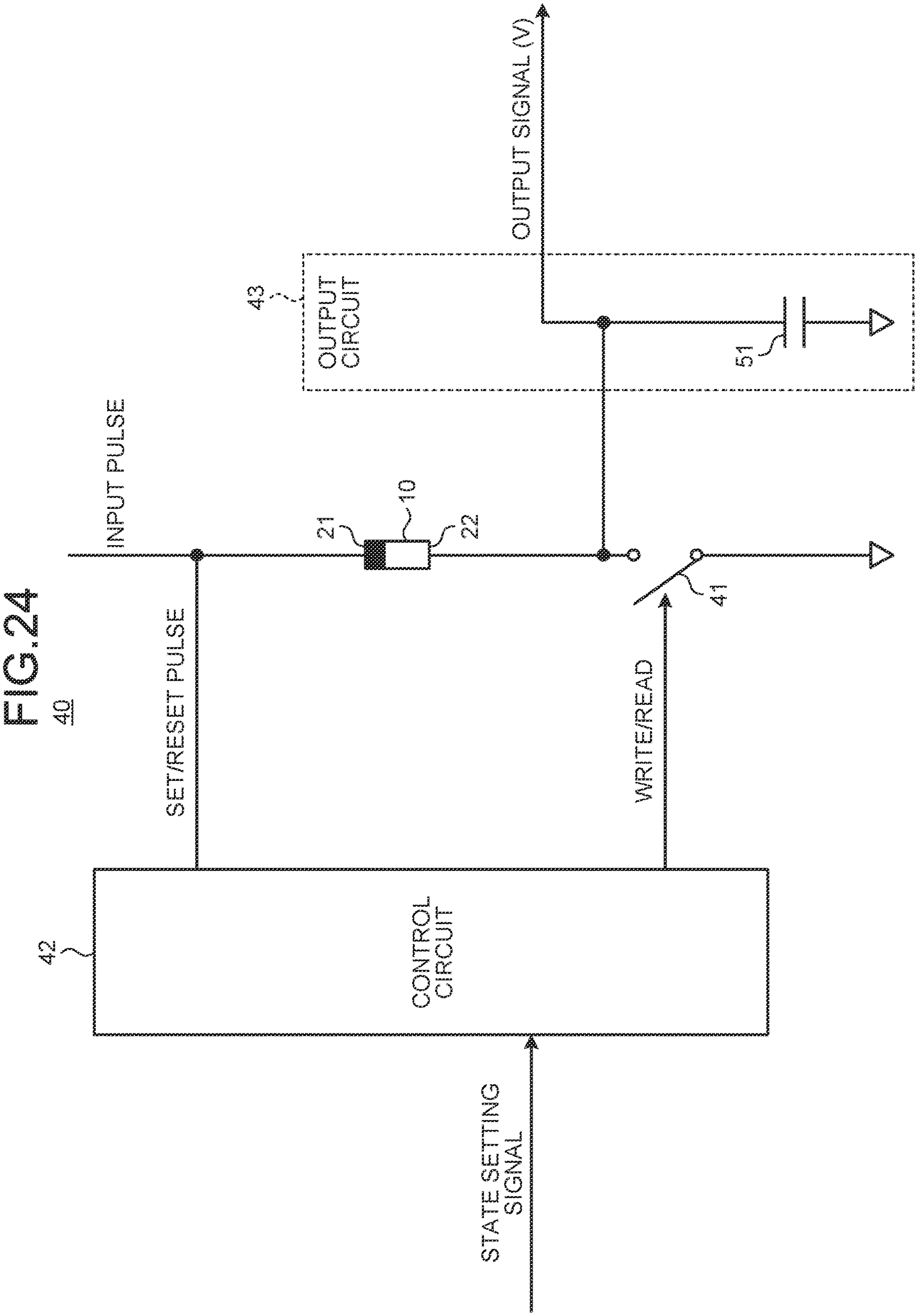
FIG. 24 is a diagram illustrating a configuration of a storage device according to a second embodiment.

FIG. 24 is a diagram illustrating a configuration of the storage device 40 according to the second embodiment. The storage device 40 according to the second embodiment includes a variable resistance element 10, a switch 41, a control circuit 42, and an output circuit 43.

The switch 41 short-circuits or opens between the second electrode 22 of the variable resistance element 10 and the ground. The control of short-circuit and opening of the switch 41 is performed by the control circuit 42. The switch 41 is implemented by a Metal-Oxide-Semiconductor Field Effect Transistor (MOSFET), for example.

The control circuit 42 applies, at the time of writing, voltage between the first electrode 21 and the second electrode 22, which is voltage causing the lithium ions to move between the first transition metal compound layer 23 and the second transition metal compound layer 24, thereby controlling the variable resistance element 10 to be in a low resistance state or a high resistance state. In addition, the control circuit 42 controls the switch 41 to enable the external circuit to read the state of the variable resistance element 10 at the time of reading.

Specifically, at the time of writing, the control circuit 42 short-circuits the switch 41 to connect the second electrode 22 of the variable resistance element 10 to the ground. This enables the control circuit 42 to apply the set pulse and the reset pulse to the first electrode 21 of the variable resistance element 10.

In addition, at the time of writing, the control circuit 42 receives a state setting signal from a circuit serving to manage the state of the variable resistance element 10. The state setting signal represents an instruction to change the variable resistance element 10 to be in the low resistance state or an instruction to change the variable resistance element 10 to be in the high resistance state.

When the instruction to change the state to the low resistance state is received at the time of writing, the control circuit 42 applies a set pulse to the variable resistance element 10. That is, the control circuit 42 applies, to the first electrode 21, a positive voltage higher than the second electrode 22 to move lithium ions contained in the first transition metal compound layer 23 toward the second transition metal compound layer 24, thereby changing the variable resistance element 10 to the low resistance state.

In addition, when the instruction to change the state to the high resistance state is received at the time of writing, the control circuit 42 applies a reset pulse to the variable resistance element 10. That is, the control circuit 42 applies, to the first electrode 21, a negative voltage lower than the second electrode 22 to move lithium ions contained in the second transition metal compound layer 24 toward the first transition metal compound layer 23, thereby changing the variable resistance element 10 to the high resistance state in which no electric current flows when high voltage is applied to the first electrode 21 side.

Moreover, the control circuit 42 may short-circuit the first electrode 21 and the second electrode 22 to each other after applying the set pulse to the variable resistance element 10, that is, applying, to the first electrode 21, a positive voltage higher than the second electrode 22 to move the lithium ions contained in the first transition metal compound layer 23 toward the second transition metal compound layer 24. This enables the control circuit 42 to cause the electromotive force to be zero in the variable resistance element 10.

In addition, at the time of reading, the control circuit 42 opens the switch 41 to disconnect the second electrode 22 of the variable resistance element 10 from the ground. With this operation, the control circuit 42 can make the state of the variable resistance element 10 readable by an external circuit at the time of reading.

The first electrode 21 of the variable resistance element 10 is connected to an external circuit serving to generate an input pulse. In the variable resistance element aur input pulse having voltage higher than the second electrode 22 is applied to the first electrode 21 from the external circuit at the time of reading. The storage device 40 may include a pulse generation circuit serving to receive a read instruction from an external circuit and generate an input pulse after receiving the read instruction.

The output circuit 43 outputs an output signal indicating whether or not electric current flows through the variable resistance element 10 at a timing of applying an input pulse to the variable resistance element 10. For example, the output circuit 43 includes a capacitor 51. In the capacitor 51, one terminal is connected to the second electrode 22 of the variable resistance element 10, and the other terminal is connected to the ground. The output circuit 43 outputs, as an output signal, voltage (V) of a connection point between the capacitor 51 and the second electrode 22 of the variable resistance element 10.

In such a storage device 40, when an input pulse is applied to the variable resistance element 10 being in the low resistance state at the time of reading, electric current flows through the variable resistance element 10. As a result, the output circuit 43 can output an output signal having voltage higher than a given value.

On the other hand, in the storage device 40, when an input pulse is applied to the variable resistance element 10 being in the high resistance state at the time of reading, no electric current flows through the variable resistance element 10. As a result, the output circuit 43 can output an output signal having voltage of a given value or less.

As described above, the storage device 40 according to the second embodiment can change the variable resistance element 10 to the low resistance state when having received an instruction to change the state to the low resistance state at the time of writing. In addition, the storage device 40 according to the second embodiment can change the variable resistance element 10 to the high resistance state when having received an instruction to change the state to the high resistance state at the time of writing.

Moreover, when having received an input pulse at the time of reading, the storage device 40 according to the second embodiment can output an output signal having voltage higher than a given value when the variable resistance element 10 is in the low resistance state. Furthermore, when having received an input pulse at the time of reading, the storage device 40 according to the second embodiment can output an output signal having voltage of a given value or less when the variable resistance element 10 is in the high resistance state.

The storage device 40 according to the second embodiment can change the state of the variable resistance element 10 in accordance with an instruction from an external circuit, and can output the state of the variable resistance element 10 to the external circuit, Therefore, the storage device 40 can function as a storage device serving to store binary information.

Third Embodiment

Next, a storage device 40 according to a third embodiment will be described. The storage device 40 according to the third embodiment has substantially the same function and configuration as those of the second embodiment. Therefore, members having substantially the same function and configuration as those of the second embodiment are denoted by the same reference numerals, and detailed description thereof is omitted except for differences.

Figure 25:
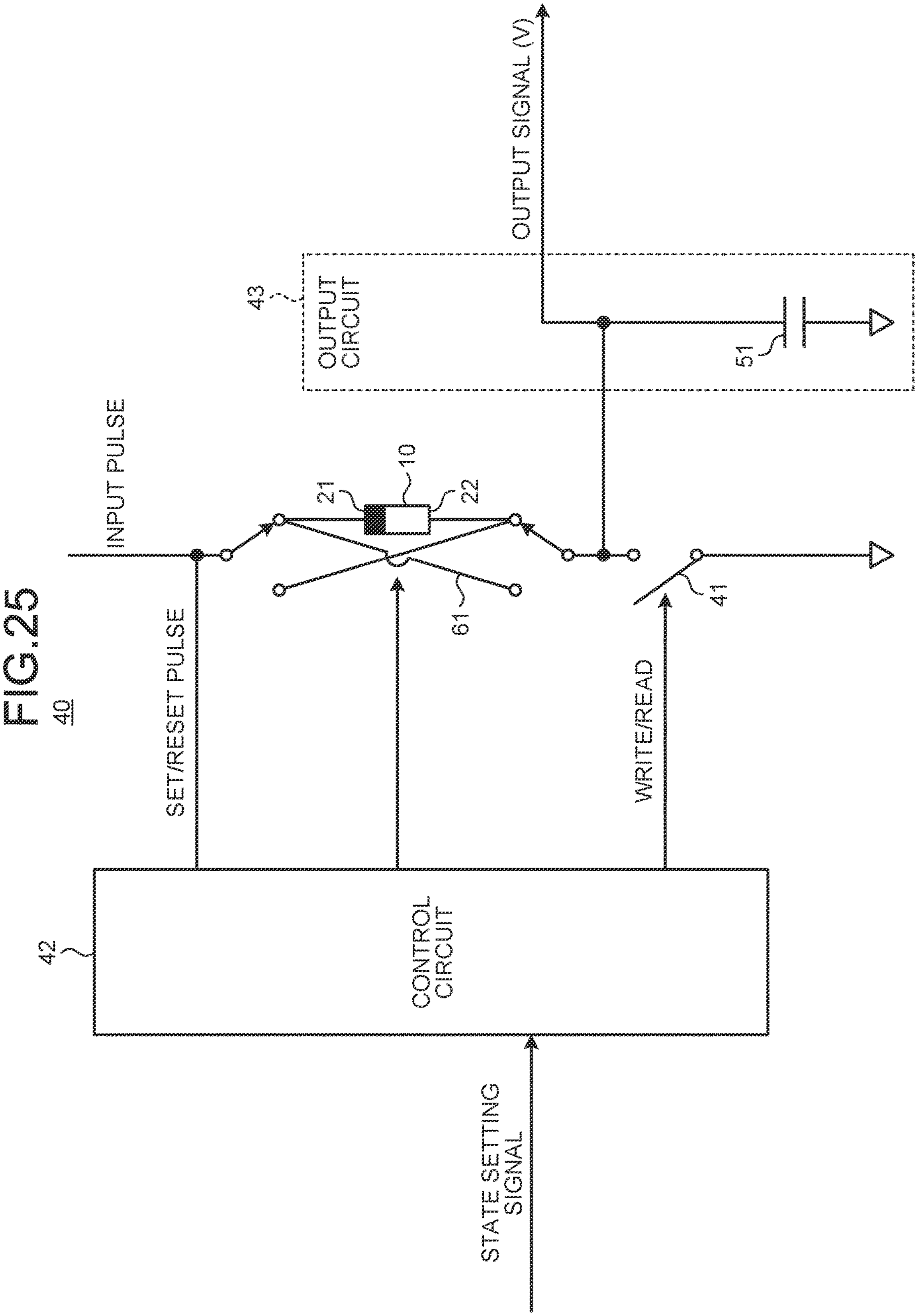
FIG. 25 is a diagram illustrating a configuration of a storage device according to a third embodiment.

FIG. 25 is a diagram illustrating a configuration of the storage device 40 according to the third embodiment. The storage device 40 according to the third embodiment further includes a positive/negative inversion circuit 61.

Under the control of the control circuit 42, the positive/negative inversion circuit 61 switches between application of an input pulse supplied from an external circuit to the variable resistance element 10 as a first input pulse having voltage higher than the second electrode 22 to the first electrode 21 and application of an input pulse to the variable resistance element 10 as a second input pulse having voltage higher than the first electrode 21 to the second electrode 22. That is, the positive/negative inversion circuit 61 switches the connection relationship between the first electrode 21 and the second electrode 22 under the control of the control circuit 42. This enables application of voltage onto the variable resistance element 10 at the time of reading such that the first input pulse having voltage higher than the second electrode 22 is applied to the first electrode 21 or the second input pulse having voltage higher than the first electrode 21 is applied to the second electrode 22.

At the time of reading, every time the first input pulse or the second input pulse is applied a given number of times, the control circuit 42 switches between application of the first input pulse and application of the second input pulse.

For example, after changing the state of the variable resistance element 10, the control circuit 42 switches the positive/negative inversion circuit 61 such that the first input pulse is applied to the variable resistance element 10. Subsequently, at the time of reading, after the first input pulse is applied to the variable resistance element 10 a given number of times, the control circuit 42 switches the positive/negative inversion circuit 61 such that the second input pulse is applied to the positive/negative inversion circuit 61. Subsequently, at the time of reading, after the second input pulse is applied to the variable resistance element 10 a given number of times, the control circuit 42 switches the positive/negative inversion circuit 61 such that the first input pulse is applied to the positive/negative inversion circuit 61. The control circuit 42 repeats such switching processing at the time of reading.

The output circuit 43 outputs an output signal indicating whether or not electric current flows through the variable resistance element 10 at a timing of application of the first input pulse or the second input pulse. For example, when the first input pulse is applied to the variable resistance element 10, the output circuit 43 outputs voltage of the second electrode 22 of the variable resistance element 10 as an output signal. In addition, for example, when the second input pulse is applied to the variable resistance element 10, the output circuit 43 outputs voltage of the first electrode 21 of the variable resistance element 10 as an output signal.

With the storage device 40 according to the third embodiment, the amount of lithium ions moved from the first transition metal compound layer 23 to the second transition metal compound layer 24 by application of the first input pulse can be returned to the first transition metal compound layer 23 by application of the second input pulse. With this operation, the storage device 40 according to the third embodiment can pass electric current through the variable resistance element 10 so as not to exceed the upper limit of the electric current that can flow through the variable resistance element 10 when the variable resistance element 10 is in the low resistance state. This makes it possible for the storage device 40 to read the state of the variable resistance element 10 by an external circuit without limiting the number of times of reading.

Fourth Embodiment

Next, a storage device 40 according to a fourth embodiment will be described. Since the storage device 40 according to the fourth embodiment has substantially the same function and configuration as those of the second embodiment. Therefore, members having substantially the same function and configuration as those of the second embodiment are denoted by the same reference numerals, and detailed description thereof is omitted except for differences.

Figure 26:
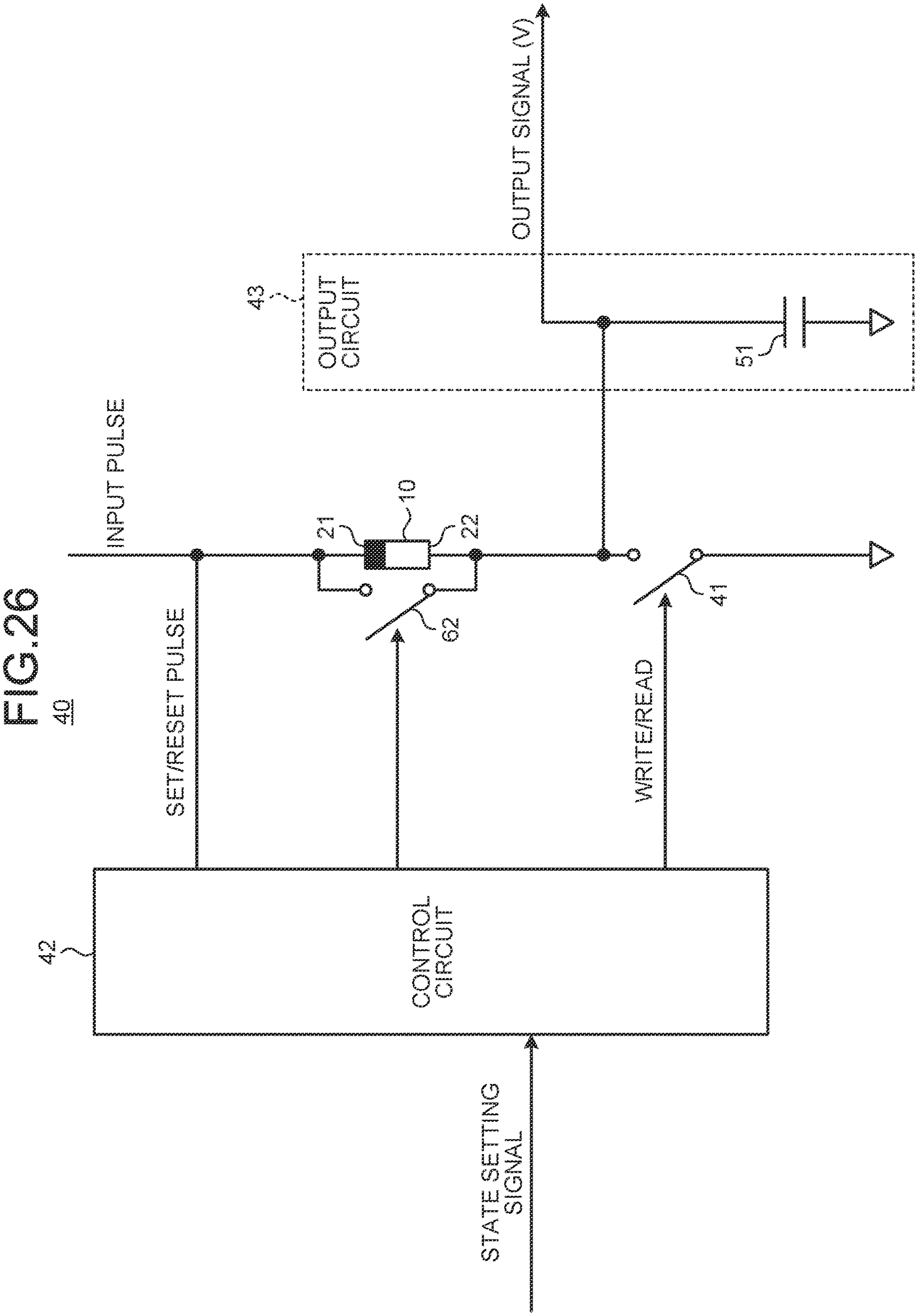
FIG. 26 is a diagram illustrating a configuration of a storage device according to a fourth embodiment.

FIG. 26 is a diagram illustrating a configuration of the storage device 40 according to the fourth embodiment. The storage device 40 according to the fourth embodiment further includes a short-circuit switch 62. The short-circuit switch 62 is implemented by a MOSFET, for example.

Under the control of the control circuit 42, the short-circuit switch 62 short-circuits or opens between the first electrode 21 and the second electrode 22 of the variable resistance element 10.

At the time of reading, every time an input pulse is applied a given number of times, the control circuit 42 short-circuits the first electrode 21 and the second electrode 22 to each other for a given period of time to electrically connect to each other.

By short-circuiting between the first electrode 21 and the second electrode 22 in the storage device 40 according to the fourth embodiment, the lithium ions moved from the first transition metal compound layer 23 to the second transition metal compound layer 24 by application of the input pulse can be returned to the first transition metal compound layer 23 by the electromotive force generated by the variable resistance element 10. With this operation, the storage device 40 according to the fourth embodiment can pass electric current through the variable resistance element 10 so as not to exceed the upper limit of the electric current that can flow through the variable resistance element 10 when the variable resistance element 10 is in the low resistance state. This makes it possible for the storage device 40 to read the state of the variable resistance element 10 by an external circuit without limiting the number of times of reading.

Fifth Embodiment

Next, a storage device 40 according to a fifth embodiment will be described. Since the storage device 40 according to the fifth embodiment has substantially the same function and configuration as those of the second embodiment. Therefore, members having substantially the same function and configuration as those of the second embodiment are denoted by the same reference numerals, and detailed description thereof is omitted except for differences.

Figure 27:
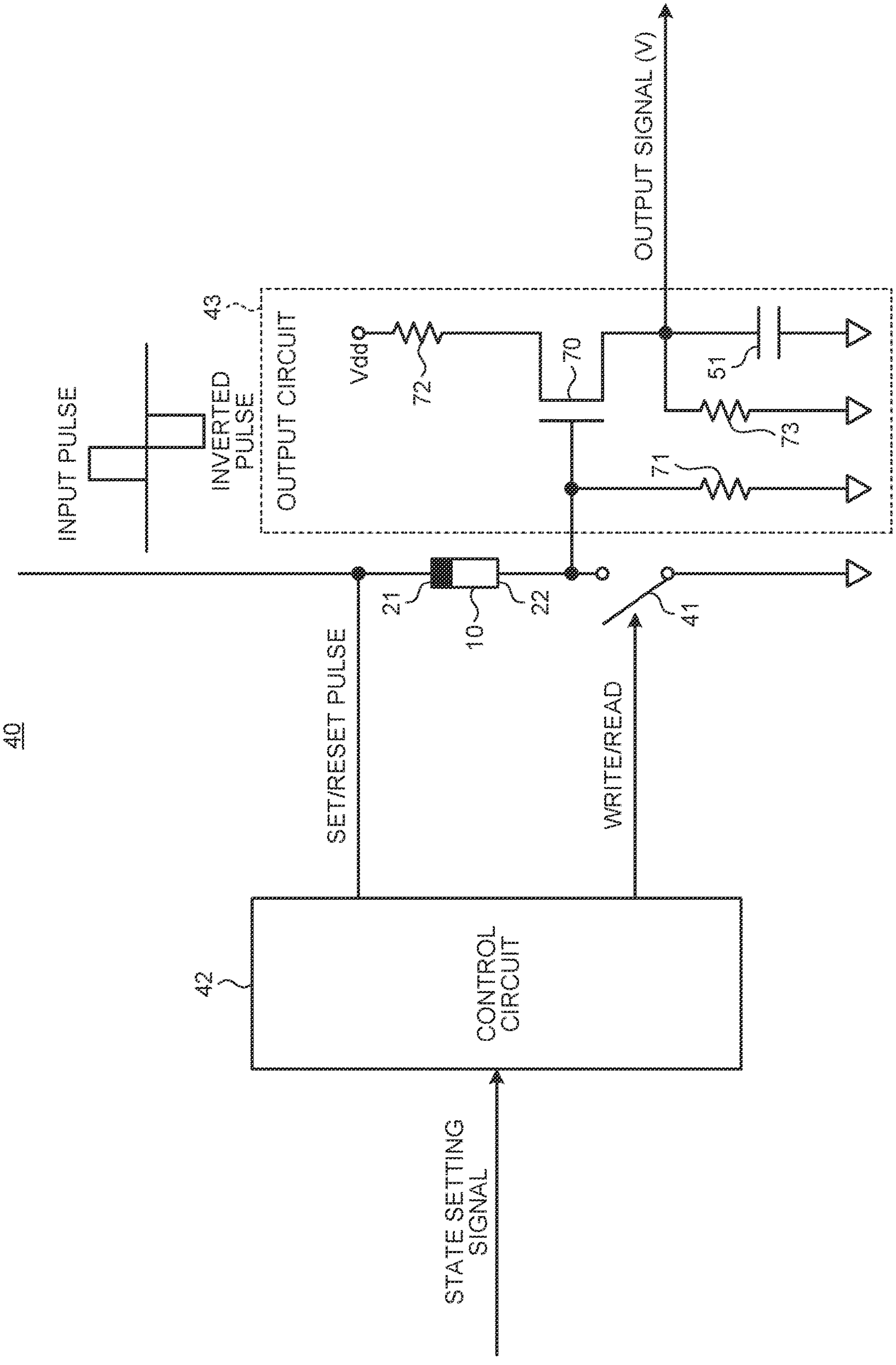
FIG. 27 is a diagram illustrating a configuration of a storage device according to a fifth embodiment.

FIG. 27 is a diagram illustrating a configuration of the storage device 40 according to the fifth embodiment.

In the variable resistance element 10, pulses are continuously applied from an external circuit at the time of reading such that an input pulse having voltage higher than the second electrode 22 is applied to the first electrode 21 and an inverted pulse having voltage lower than the second electrode 22 is applied to the first electrode 21. The input pulse may be applied to the variable resistance element 10 after the input pulse is applied, or the input pulse may be applied after the inverted pulse is applied. Note that the storage device 40 may include a pulse generation circuit serving to receive a read instruction from an external circuit and generate an input pulse and an inverted pulse continuously after receiving the read instruction.

The output circuit 43 outputs an output signal indicating whether or not electric current flows through the variable resistance element 10 at a timing of application of an input pulse to the variable resistance element 10. The output circuit 43 outputs an output signal indicating that electric current did not flow at a timing of application of an inverted pulse to the variable resistance element 10.

The output circuit 43 includes, for example, an N-type MOSFET 70, a first resistor 71, a second resistor 72, a third resistor 73, and a capacitor 51. In the N-type MOSFET 70, a gate is connected to the second electrode 22 of the variable resistance element 10. The first resistor 71 is connected between the gate of the N-type MOSFET 70 and the ground. The second resistor 72 is connected between the drain of the N-type MOSFET 70 and the power supply voltage (Vdd). The third resistor 73 is connected between the collector of the N-type MOSFET 70 and the ground. In the capacitor 51, one terminal is connected to the collector of the N-type MOSFET 70 and the other terminal is connected to the ground.

The output circuit 43 outputs, as an output signal, voltage (V) of a connection point between the capacitor 51 and the collector of the N-type MOSFET 70.

In such a storage device 40, at the timing of application of an input pulse to the variable resistance element 10 in the low resistance state at the time of reading, electric current flows through the variable resistance element 10. Therefore, voltage higher than a threshold is applied to the gate of the N-type MOSFET 70, turning on the drain-source path. With this configuration, when an input pulse has been applied to the variable resistance element 10 in the low resistance state at the time of reading, the output circuit 43 can output an output signal at a power supply voltage level.

In addition, in such a storage device 40, when an input pulse is applied to the variable resistance element 10 in the high resistance state at the time of reading, no electric current flows through the variable resistance element 10. Therefore, voltage lower than the threshold is applied to the gate of the N-type MOSFET 70, turning off the drain-source path. With this configuration, when an input pulse has been applied to the variable resistance element 10 in the low resistance state at the time of reading, the output circuit 43 can output an output signal at a ground level.

Moreover, in the storage device 40 like this, at the timing of application of an inverted pulse to the variable resistance element 10 at the time of reading, no electric current flows through the variable resistance element 10. Therefore, voltage lower than the threshold is applied to the gate of the N-type MOSFET 70, turning off the drain-source path. With this configuration, when an inverted pulse has been applied to the variable resistance element 10 at the time of reading, the output circuit 43 can output an output signal at a ground level.

According to the storage device 40 of the fifth embodiment, the amount of lithium ions moved from the first transition metal compound layer 23 to the second transition metal compound layer 24 by application of the input pulse can be returned to the first transition metal compound layer 23 by application of the inverted pulse. With this operation, the storage device 40 according to the fifth embodiment can pass electric current through the variable resistance element 10 so as not to exceed the upper limit of the electric current that can flow through the variable resistance element 10 when the variable resistance element 10 is in the low resistance state. This makes it possible for the storage device 40 to read the state of the variable resistance element 10 by an external circuit without limiting the number of times of reading.

Sixth Embodiment

Hereinafter, a neural network apparatus 80 according to a sixth embodiment will be described, In the neural network apparatus 80 according to the sixth embodiment, the storage device 40 described in the second to fifth embodiments is used as a storage element.

Hereinafter, a neural network apparatus 80 according to the sixth embodiment will be described with reference to the drawings.

Figure 28:
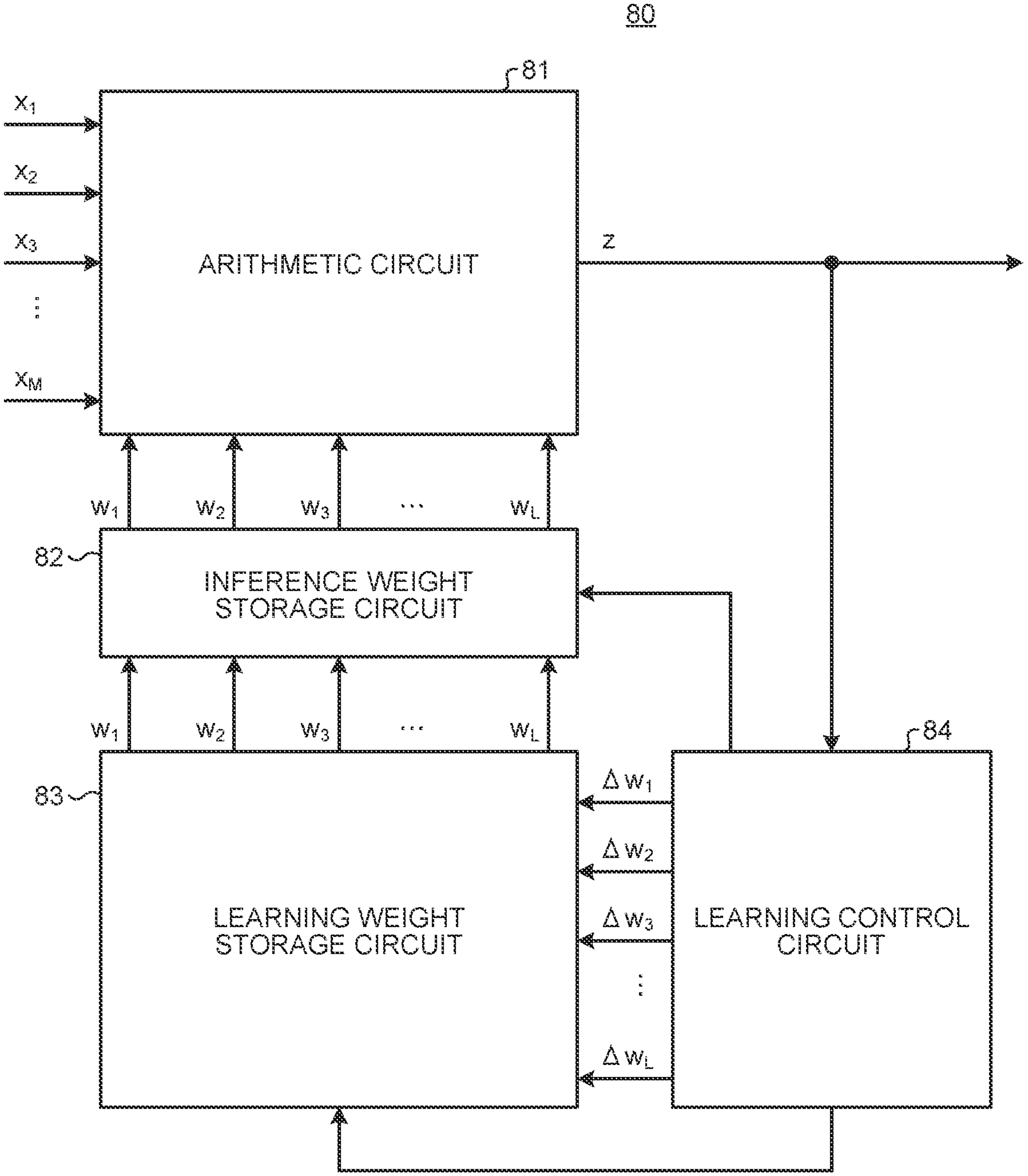
FIG. 28 is a diagram illustrating a configuration of a neural network apparatus according to a sixth embodiment.

FIG. 28 is a diagram illustrating a configuration of the neural network apparatus 80 according to the sixth embodiment. The neural network apparatus 80 includes an arithmetic circuit 81, an inference weight storage circuit 82, a learning weight storage circuit 83, and a learning control circuit 84.

The arithmetic circuit 81 executes arithmetic processing in accordance with a neural network. The arithmetic circuit 81 may be implemented by an electric circuit including an analog circuit. For example, the arithmetic circuit 81 receives M input signals ($x_1, \ldots, x_M$) (M is an integer of 2 or more) and outputs an output signal (z). The arithmetic circuit 81 may output a plurality of output signals.

The inference weight storage circuit 82 includes a plurality of storage devices 40 corresponding to a plurality of inference weights used in arithmetic processing based on the neural network performed by the arithmetic circuit 81. The inference weight storage circuit 82 stores L inference weights (L is an. integer of 2 or more), for example, in the storage devices 40. Each of the inference weights is binary. For example, each of the storage devices 40 represents a first value (for example, 1, +1, or logical H) of the two values in the low resistance state, for example, and represents a second value (for example, 0, −1, or logical L) of the two values in the high resistance state, for example. This enables the arithmetic circuit 81 to execute arithmetic processing according to the neural network at high speed by the analog circuit by using inference weights each of which being represented by binary. Note that the inference weight storage circuit 82 may be incorporated in the arithmetic circuit 81.

The learning weight storage circuit 83 stores a plurality of weights corresponding to a plurality of inference weights in the learning process of the neural network. The learning weight storage circuit 83 stores L weights ($w_1, \ldots, w_L$) that correspond one-to-one with L inference weights, for example. Each of the weights is a continuous value (for example, an analog amount or a digital value of a given number of bits).

In the learning process of the neural network, the learning control circuit 84 causes the learning weight storage circuit 83 to store the initial values of a plurality of weights. Subsequently, the learning control circuit 84 repeats an update process a plurality of times. In the update process, the learning control circuit 84 generates an update amount ($\Delta w_1, \ldots, \Delta w_L$) corresponding to each of the weights based on the calculation result obtained by the arithmetic circuit 81, and gives the generated update amount to the learning weight storage circuit 83 so as to update each of the weights stored in the learning weight storage circuit 83. The number of times of execution of the update process by the learning control circuit 84 may be only one. After the learning process, the learning control circuit 84 controls the inference weight storage circuit 82 to store a plurality of output values corresponding to the plurality of weights stored in the learning weight storage circuit 83, as a plurality of inference weights.

In this manner, the learning control circuit 84 executes the learning process applied to the neural network by using a plurality of weights expressed in continuous values. This enables the learning control circuit 84 to increase or decrease each of the weights by a minute amount in the learning process, making it possible to apply high-precision learning to the neural network.

Figure 29:
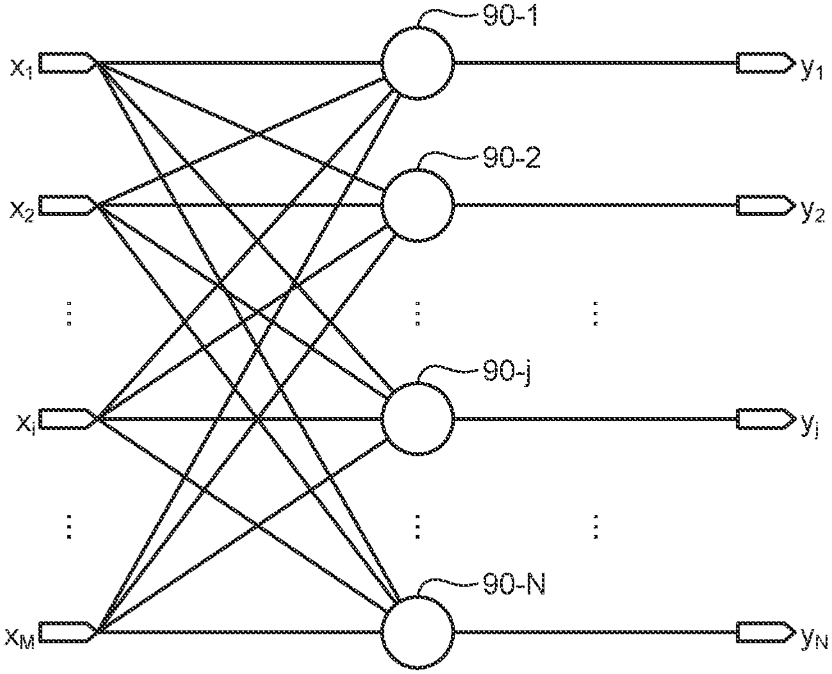
FIG. 29 is diagram illustrating one layer of a neural network.

FIG. 29 is diagram illustrating one layer of a neural network. The neural network includes, for example, one or more layers as illustrated in FIG. 29. The arithmetic circuit 81 includes a circuit serving to execute an arithmetic operation corresponding to a layer as illustrated in FIG. 29.

In order to execute layer operations as illustrated in FIG. 29, the arithmetic circuit 81 includes N product-sum operation circuits 90 (90-1 to 90-N) corresponding to N (N is an integer of 2 or more) intermediate signals ($y_1$ to $y_N$), for example. The j-th product-sum operation circuit 90-*j* (j is an arbitrary integer from 1 to N) of the N product-sum operation circuits 90 corresponds to the j-th intermediate signal ($y_j$). Each of the N product-sum operation circuits 90 receives M input signals ($x_1$ to $x_M$).

Figure 30:
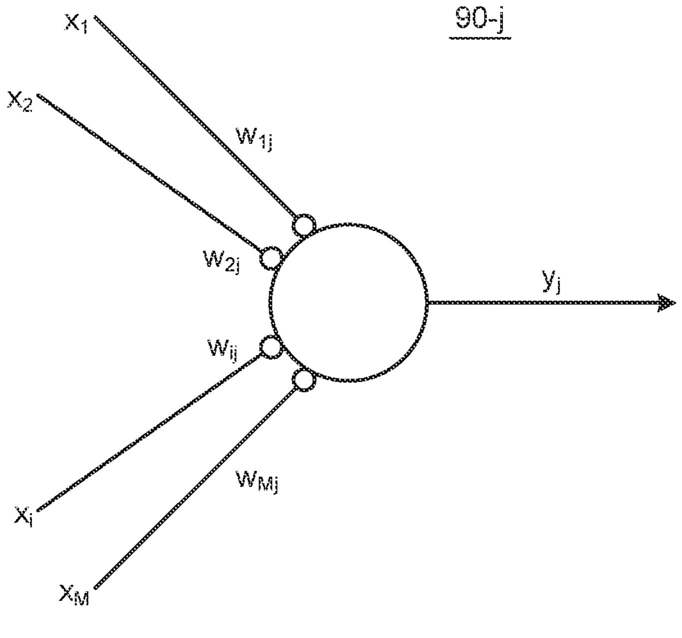
FIG. 30 is a diagram illustrating a product-sum operation performed by a product-sum operation circuit.

FIG. 30 is a diagram illustrating a product-sum operation by the product-sum operation circuit 90. Each of the N product-sum operation circuits 90 has M inference weights ($w_{1j}, w_{2j}, \ldots, w_{ij}, \ldots, w_{Mj}$) corresponding to M input signals from the inference weight storage circuit 82.

Each of the N product-sum operation circuits 90 outputs an intermediate signal generated by binarizing the value obtained by the product-sum operation of M input signals and M inference weights. For example, the product-sum operation circuit 90-*j* corresponding to the j-th intermediate signal executes the arithmetic operation of the following Formula (1) in an analog operation.

$$y_j = f\left(\sum_{i=1}^{M} X_i W_{ij}\right) \quad (1)$$

In Formula (1), $y_j$ represents the j-th intermediate signal. $x_i$ represents the i-th input signal (i is an integer that is 1 or more and M or less). $w_{ij}$ represents an inference weight to be multiplied by the i-th input signal out of the M inference weights. In Formula (1), f(X) represents a function that binarizes a value X in parentheses with a given threshold. Furthermore, bias (b) which is a constant may be added to $y_j$.

The neural network apparatus 80 according to the sixth embodiment as described above stores the inference weight used for the arithmetic operation in the neural network by the storage device 40 using the variable resistance element 10. This makes it possible for the neural network apparatus 80 to store the inference weight in the variable resistance element 10 having a small characteristic variation, leading to execution of accurate arithmetic operations.

While certain embodiments have been described, these embodiments have been presented by way of example only, and are not intended to limit the scope of the inventions, indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fail within the scope and spirit of the inventions.

What is claimed is:

1. A variable resistance element changing to a low resistance state or a high resistance state, the variable resistance element comprising:

a first transition metal compound layer connected to a first electrode, the first transition metal compound layer being a metal compound containing lithium ions in lattice interstices;

a second transition metal compound layer connected to a second electrode, the second transition metal compound layer being a metal compound containing lithium ions in lattice interstices; and a lithium ion conductor layer provided between the first transition metal compound layer and the second transition metal compound layer, the lithium ion conductor layer being a solid substance having electron permeability lower than lithium ion permeability, wherein the second transition metal compound layer is thinner, in film thickness in a stacking direction, than the first transition metal compound layer.

2. The variable resistance element according to claim 1, wherein the first transition metal compound layer is formed of $Li_{x-y}TiO_2$, and the second transition metal compound layer is formed of $Li_yTiO_2$, where x denotes a constant greater than 0 and y denotes a variable having a value of 0 or more and x or less.

3. The variable resistance element according to claim 2, wherein the second transition metal compound layer has a composition ratio of Ti to O being 1:2.

4. The variable resistance element according to claim 1, wherein the first transition metal compound layer is formed of $Li_{x-y}ZrO_2$, and the second transition metal compound layer is formed of $Li_yZrO_2$, where x denotes a constant greater than 0 and y denotes a variable having a value of 0 or more and x or less.

5. The variable resistance element according to claim 1, wherein the first transition metal compound layer is formed of $Li_{x-y}HfO_2$, and the second transition metal compound layer is formed of $Li_yHfO_2$, where x denotes a constant greater than 0 and y denotes a variable having a value of 0 or more and x or less.

6. The variable resistance element according to claim 1, wherein a difference between a Fermi level of the lithium ion conductor layer and respective Fermi levels of the first transition metal compound layer and the second transition metal compound layer is 1 electron volt or less.

7. The variable resistance element according to claim 1, wherein the lithium ion conductor layer includes:

a first electrolyte layer to be connected to the first transition metal compound layer;

a second electrolyte layer; and a third electrolyte layer to be connected to the second transition metal compound layer, the second electrolyte layer is included between the first electrolyte layer and the third electrolyte layer, and a resistivity regarding electron conduction in each of the first electrolyte layer and the third electrolyte layer is higher than the resistivity regarding electron conduction in the second electrolyte layer.

8. The variable resistance element according to claim 7, wherein, in each of the first electrolyte layer and the third electrolyte layer, the resistivity regarding electron conduction is $10^8$ Ωm or more.

9. The variable resistance element according to claim 7, wherein ionic conductivity in each of the first electrolyte layer and the third electrolyte layer is lower than the ionic conductivity in the second electrolyte layer.

10. The variable resistance element according to claim 7, wherein a film thickness in the stacking direction in each of the first electrolyte layer and the third electrolyte layer is smaller than the film thickness in the stacking direction in the second electrolyte layer.

11. A storage device comprising:

the variable resistance element according to claim 1; and a control circuit configured to control the variable resistance element to be in the low resistance state or in the high resistance state, the low resistance state being a state where electric current is allowed to flow between the first and second transition metal compound layers, the high resistance state being a state where no electric current flows in a given direction between the first and second transition metal compound layers, the control circuit performing the control of the variable resistance element by applying voltage between the first electrode and the second electrode, the voltage causing the lithium ions to move between the first and second transition metal compound layers.

12. The storage device according to claim 11, wherein the control circuit is configured to change the variable resistance element to be in the low resistance state by applying, to the first electrode, a positive voltage higher than the second electrode to move the lithium ions contained in the first transition metal compound layer to the second transition metal compound layer.

13. The storage device according to claim 12, wherein the control circuit is configured to change the variable resistance element to be in the high resistance state in which no electric current flows when a voltage applied to the first electrode is higher than a voltage applied to the second electrode, the change of the variable resistance element being performed by applying, to the first electrode, a negative voltage lower than the second electrode to move the lithium ions contained in the second transition metal compound layer to the first transition metal compound layer.

14. The storage device according to claim 13, wherein the control circuit is configured to cause the first electrode and the second electrode to electrically connect to each other after changing the variable resistance element to be in the low resistance state by applying the positive voltage to the first electrode to move the lithium ions contained in the first transition metal compound layer to the second transition metal compound layer.

15. The storage device according to claim 11, wherein, in the variable resistance element, an input pulse having voltage higher than the second electrode is applied to the first electrode at a time of reading, and the storage device further comprises an output circuit configured to output an output signal indicating whether or not the electric current flows through the variable resistance element at a timing when the input pulse is applied.

16. The storage device according to claim 11, wherein, in the variable resistance element, a first input pulse having voltage higher than the second electrode is applied to the first electrode, or a second input pulse having voltage higher than the first electrode is applied to the second electrode at a time of reading, the storage device further comprises an output circuit configured to output an output signal indicating whether or not the electric current flows through the variable resistance element at a timing when the first input pulse or the second input pulse is applied, and the control circuit switches, at the time of reading, between application of the first input pulse and application of the second input pulse every time the first input pulse or the second input pulse is applied a given number of times.

17. The storage device according to claim 11, wherein, in the variable resistance element, an input pulse having voltage higher than the second electrode is applied to the first electrode at a time of reading, the storage device further comprises an output circuit configured to output an output signal indicating whether or not the electric current flows through the variable resistance element at a timing when the input pulse is applied, and the control circuit electrically connects the first electrode and the second electrode to each other every time the input pulse is applied a given number of times at the time of the reading.

18. The storage device according to claim 11, further comprising an output circuit configured to output an output signal indicating whether or not the electric current flows through the variable resistance element, at a timing when, in the variable resistance element, an input pulse having voltage higher than the second electrode is applied to the first electrode, wherein, in the variable resistance element, the input pulse and an inverted pulse having voltage lower than the second electrode are continuously applied to the first electrode at the time of reading.

19. A neural network apparatus comprising:

an arithmetic circuit configured to execute arithmetic processing in accordance with a neural network; and an inference weight storage circuit configured to store a plurality of inference weights used in the arithmetic processing according to the neural network executed by the arithmetic circuit, wherein the inference weight storage circuit includes a plurality of storage devices corresponding to the plurality of inference weights;

each storage device of the plurality of storage devices includes:

a variable resistance element configured to change to a low resistance state or a high resistance state, and a control circuit;

the variable resistance element includes:

a first transition metal compound layer connected to a first electrode, the first transition metal compound layer being a metal compound containing lithium ions in lattice interstices, a second transition metal compound layer connected to a second electrode, the second transition metal compound layer being a metal compound containing lithium ions in lattice interstices, and a lithium ion conductor layer provided between the first transition metal compound layer and the second transition metal compound layer, the lithium ion conductor layer being a solid substance having electron permeability lower than lithium ion permeability, wherein the second transition metal compound layer is thinner, in film thickness in a stacking direction, than the first transition metal compound layer; and the control circuit is configured to control whether electric current is allowed to flow in a given direction between the first electrode and the second electrode, the control being performed by applying, between the first electrode and the second electrode, voltage corresponding to the low resistance state or the high resistance state.

* * * * *